(12) United States Patent
Radosavljevic et al.

(10) Patent No.: US 10,943,836 B2
(45) Date of Patent: Mar. 9, 2021

(54) GALLIUM NITRIDE NMOS ON SI (111) CO-INTEGRATED WITH A SILICON PMOS

(71) Applicant: Intel Corporation, Santa Clara, CA (US)

(72) Inventors: Marko Radosavljevic, Portland, OR (US); Sansaptak Dasgupta, Hillsboro, OR (US); Valluri R. Rao, Saratoga, CA (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/884,099

(22) Filed: May 27, 2020

(65) Prior Publication Data

US 2020/0286789 A1 Sep. 10, 2020

Related U.S. Application Data

(63) Continuation of application No. 16/078,663, filed as application No. PCT/US2016/025478 on Apr. 1, 2016.

(51) Int. Cl.
*H01L 21/8258* (2006.01)
*H01L 29/778* (2006.01)
(Continued)

(52) U.S. Cl.
CPC .... *H01L 21/8258* (2013.01); *H01L 21/76224* (2013.01); *H01L 27/0605* (2013.01); *H01L 27/0924* (2013.01); *H01L 27/1207* (2013.01); *H01L 29/045* (2013.01); *H01L 29/0649* (2013.01); *H01L 29/66462* (2013.01); *H01L 29/7786* (2013.01); *H01L 29/78* (2013.01); (Continued)

(58) Field of Classification Search
CPC ........................ H01L 25/16; H01L 27/1207
See application file for complete search history.

(56) References Cited

U.S. PATENT DOCUMENTS 6,235,567 B1  5/2001  Huang
10,600,787 B2  3/2020  Dasgupta et al.
(Continued)

FOREIGN PATENT DOCUMENTS

KR  20130054010 A  5/2013
TW    201513303 A  4/2015
(Continued)

OTHER PUBLICATIONS

International Search Report and Written Opinion issued in PCT Application No. PCT/US2016/025478 dated Dec. 28, 2016; 10 pages.
(Continued)

*Primary Examiner* — Yu-Hsi D Sun
(74) *Attorney, Agent, or Firm* — Patent Capital Group

(57) ABSTRACT

A complementary metal oxide semiconductor (CMOS) device that includes a gallium nitride n-type MOS and a silicon P-type MOS is disclosed. The device includes silicon 111 substrate, a gallium nitride transistor formed in a trench in the silicon 111 substrate, the gallium nitride transistor comprising a source electrode, a gate electrode, and a drain electrode. The device further includes a silicon/polysilicon layer formed over the gallium nitride transistor.

18 Claims, 22 Drawing Sheets

(51) Int. Cl.
*H01L 29/78* (2006.01)
*H01L 27/092* (2006.01)
*H01L 29/06* (2006.01)
*H01L 29/66* (2006.01)
*H01L 29/04* (2006.01)
*H01L 27/12* (2006.01)
*H01L 21/762* (2006.01)
*H01L 27/06* (2006.01)
*H01L 29/20* (2006.01)
*H01L 29/423* (2006.01)
*H01L 29/417* (2006.01)

(52) U.S. Cl.
CPC .... *H01L 29/2003* (2013.01); *H01L 29/41766* (2013.01); *H01L 29/4236* (2013.01); *H01L 29/7851* (2013.01)

(56) References Cited

U.S. PATENT DOCUMENTS

| | | |
|---|---|---|
| 2008/0070355 A1 | 3/2008 | Lochtefeld et al. |
| 2009/0230432 A1 | 9/2009 | Miyashita |
| 2012/0305992 A1 | 12/2012 | Marino et al. |
| 2013/0119507 A1 | 5/2013 | Lee et al. |
| 2014/0361371 A1* | 12/2014 | Comeau ............. H01L 27/1207 257/351 |
| 2014/0367695 A1 | 12/2014 | Barlow |
| 2016/0373106 A1* | 12/2016 | Shah ................... H01L 27/0629 |
| 2017/0260651 A1* | 9/2017 | Robinson ......... H01L 21/02491 |
| 2019/0058041 A1* | 2/2019 | Dasgupta ............. H01L 29/045 |

FOREIGN PATENT DOCUMENTS

| | | |
|---|---|---|
| TW | 201535516 A | 9/2015 |
| TW | 201539072 A | 10/2015 |
| WO | 2017171829 A1 | 10/2017 |

OTHER PUBLICATIONS

Non Final Office Action in U.S. Appl. No. 16/078,663 dated Oct. 22, 2019; 10 pages.

Notice of Allowance in U.S. Appl. No. 16/078,663 dated Mar. 12, 2020; 8 pages.

Taiwan First Office Action and Search Report in Taiwan Patent Application No. 106106228 dated Jul. 20, 2020, 6 pages including Summary of Relevance.

* cited by examiner

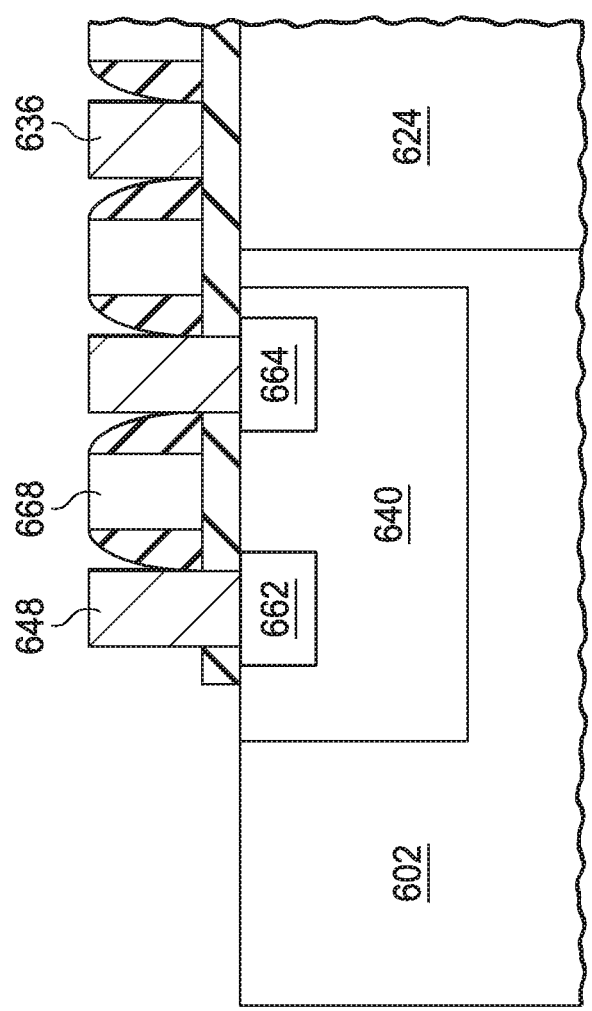

GALLIUM NITRIDE NMOS ON SI (111) CO-INTEGRATED WITH A SILICON PMOS

CROSS-REFERENCE TO RELATED APPLICATIONS

This application is a continuation of U.S. patent application Ser. No. 16/078,663 filed Aug. 22, 2018 and entitled "GALLIUM NITRIDE NMOS ON SI (111) CO-INTEGRATED WITH A SILICON PMOS," which is a national stage application under 35 U.S.C. § 371 of PCT International Application Serial No. PCT/US2016/025478, filed on Apr. 1, 2016 and entitled "GALLIUM NITRIDE NMOS ON SI (111) CO-INTEGRATED WITH A SILICON PMOS," both of which are hereby incorporated by reference in their entirety.

TECHNICAL FIELD

This disclosure pertains to combination silicon and gallium nitride (GaN) voltage regulators, and more particularly, to co-integrating silicon-based p-type metal oxide semiconductor (PMOS) and GaN-based n-type metal oxide semiconductor (NMOS) for voltage regulators and radio frequency power amplifiers.

BACKGROUND

Voltage regulators can convert high voltage to smaller voltages for use in electronic devices, such as those used in computing systems. Silicon (Si)-based voltage regulators can suffer from increasing inefficiencies at higher voltages.

BRIEF DESCRIPTION OF THE DRAWINGS

FIG. 6C is a schematic diagram of a cross section view of a silicon transistor formed adjacent to the gallium nitride NMOS transistor of FIG. 6A in accordance with embodiments of the present disclosure.

DETAILED DESCRIPTION

Figure 1:
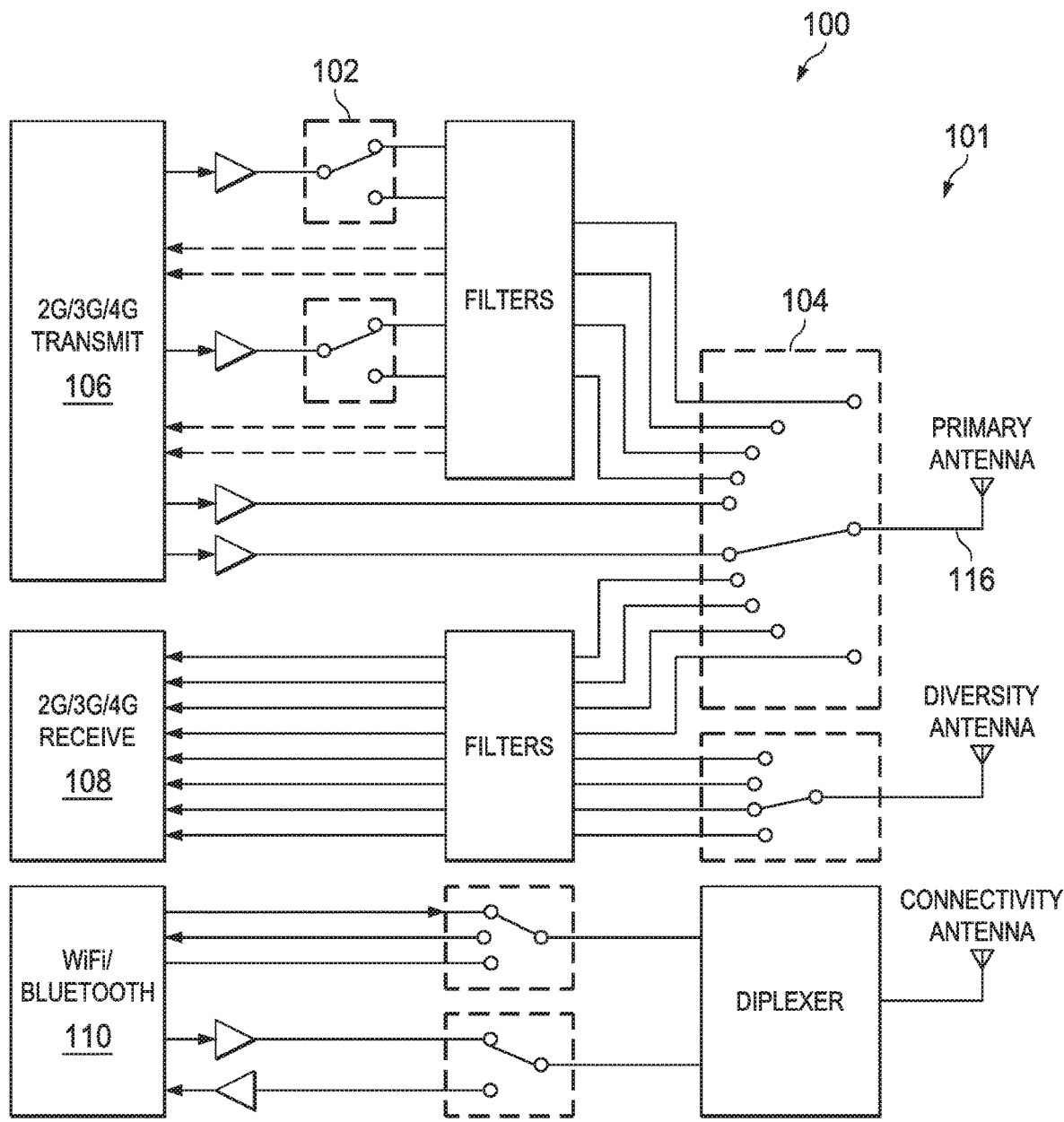
FIG. 1 is a schematic diagram of a communications device that includes a gallium nitride transistor formed on a silicon 111 substrate in accordance with embodiments of the present disclosure.

Described herein is a GaN NMOS transistor (e.g., for a voltage regulator or power amplifier) that can be formed on a silicon (Si) 111 substrate, which can accommodate the formation of a Si PMOS transistor formed on the same substrate, and methods for making the same. The use of Si 110 for a GaN NMOS substrate may pose challenges because of a crystalline symmetry mismatch between the Si and the GaN. Silicon 111 substrate can be used for the GaN NMOS instead of Si 110 because Si 111 and GaN are a hexagonal structures, resulting in a symmetry match between the two crystal structures. The silicon 111 substrate can be an n-type silicon substrate.

This disclosure describes identifying a Si PMOS trigate orientation to obtain high performance PMOS integration with a high performance GaN NMOS device on 200 or 300 mm Si 111 substrates. For monolithic high voltage devices using GaN transistors controller and driver circuits are used that utilize Si CMOS logic. Si 111 substrate is used for GaN epitaxy as it offers the lowest lattice mismatch to GaN amongst other Si substrates, and also the same crystal lattice symmetry for Wurtzite GaN epitaxy. Identifying Si PMOS orientation for high performance CMOS in a Si 111 substrate and forming a GaN NMOS device is said Si 111 substrate are described in this disclosure.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

The terms "over," "under," "between," "on," or "residing on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Furthermore, the term "residing on" is contemplated to include being formed from, such as through epitaxial growth, chemical vapor deposition, or other semiconductor processing techniques. The term "residing on" can include being electrically, physically, or electrically and physically connected. Additionally, the term "residing on" can include intermediate layers between two materials to the extent that intermediate layers are used to facilitate growth of a layer of material from or on another material. For example, a gallium nitride layer can reside on a silicon 111 substrate (e.g., an n-type silicon 111 substrate). The gallium nitride layer can be epitaxially grown on the Si 111 substrate directly or from a seed layer on the Si 111 substrate.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 is a schematic diagram of a communications device 100 that includes a gallium nitride transistor formed on a silicon 111 substrate in accordance with embodiments of the present disclosure. The communications device 100 can include various computing devices, such as a processor and a memory. As shown in FIG. 1, the communications device 100 includes a radio frequency frontend 101. Radio frequency (RF) frontend can include a radio transmitter 106, a radio receiver 108, and/or a wifi or Bluetooth (or other short range wireless radio) 110. In some embodiments, the RF frontend 101 can include a cellular transceiver configured to transmit and receive radio signals in a wireless format from one or more antennas 116.

The RF frontend 101 can also include a switch, such as switch 102 or switch 104. The switch 102 or 104 can include one or more GaN NMOS transistors as well as other types of transistors. GaN NMOS transistors can accommodate higher voltages than Si-based NMOS transistors.

Figure 2:
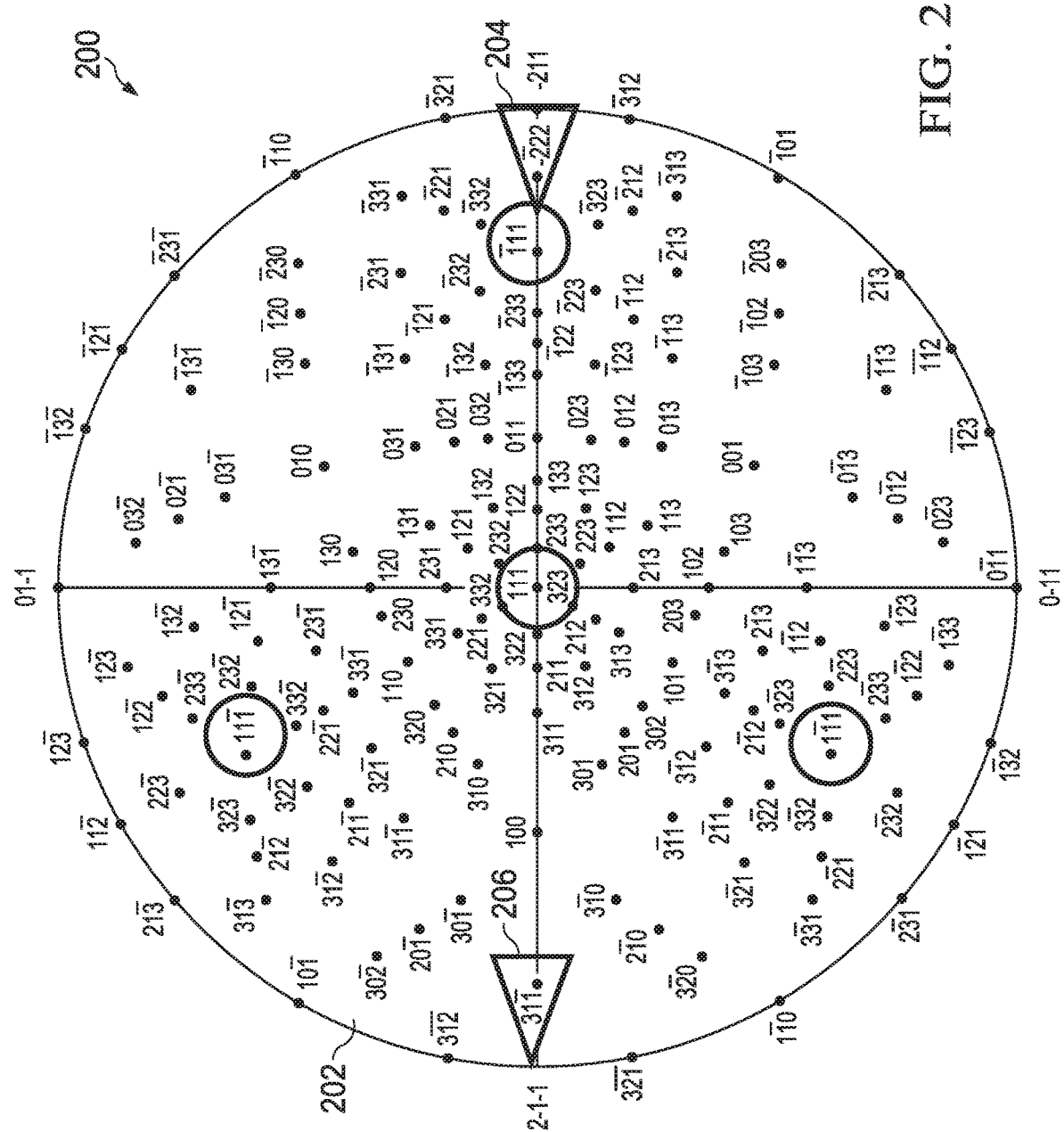
FIG. 2 is a schematic illustration of a stereographic representation of a silicon 111 wafer and notch locations in accordance with embodiments of the present disclosure.

FIG. 2 is a schematic illustration of a stereographic representation of a silicon 111 wafer 202 and notch locations 204 and 206 in accordance with embodiments of the present disclosure. The silicon 111 wafer 202 can be a 300 mm wafer. The stereographic projection shows relativistic positions of silicon atoms for different crystal orientations projected onto a two-dimensional surface. The stereographic projection can be used to show locations on a wafer where the wafer should be notched for identification of the crystallographic planes of the wafer for semiconductor processing. The projection shows the 111 projection at the center (circled) and the equivalent orientation atoms projected and circled.

In FIG. 2, a first notch is made at a first notch location 204 at a point where a −211 atomic projection is located. The −211 atomic projection is 90 degrees from the 01-1 and 0-11 atomic projection points on the circumference of the silicon 111 wafer 202. In some embodiments, a notch can be made at notch location 206, which coincides with the 2-1-1 atomic projection. The 2-1-1 atomic projection is also 90 degrees from the 01-1 and 0-11 atomic projection points on the circumference of the silicon 111 wafer 202.

Figure 3:
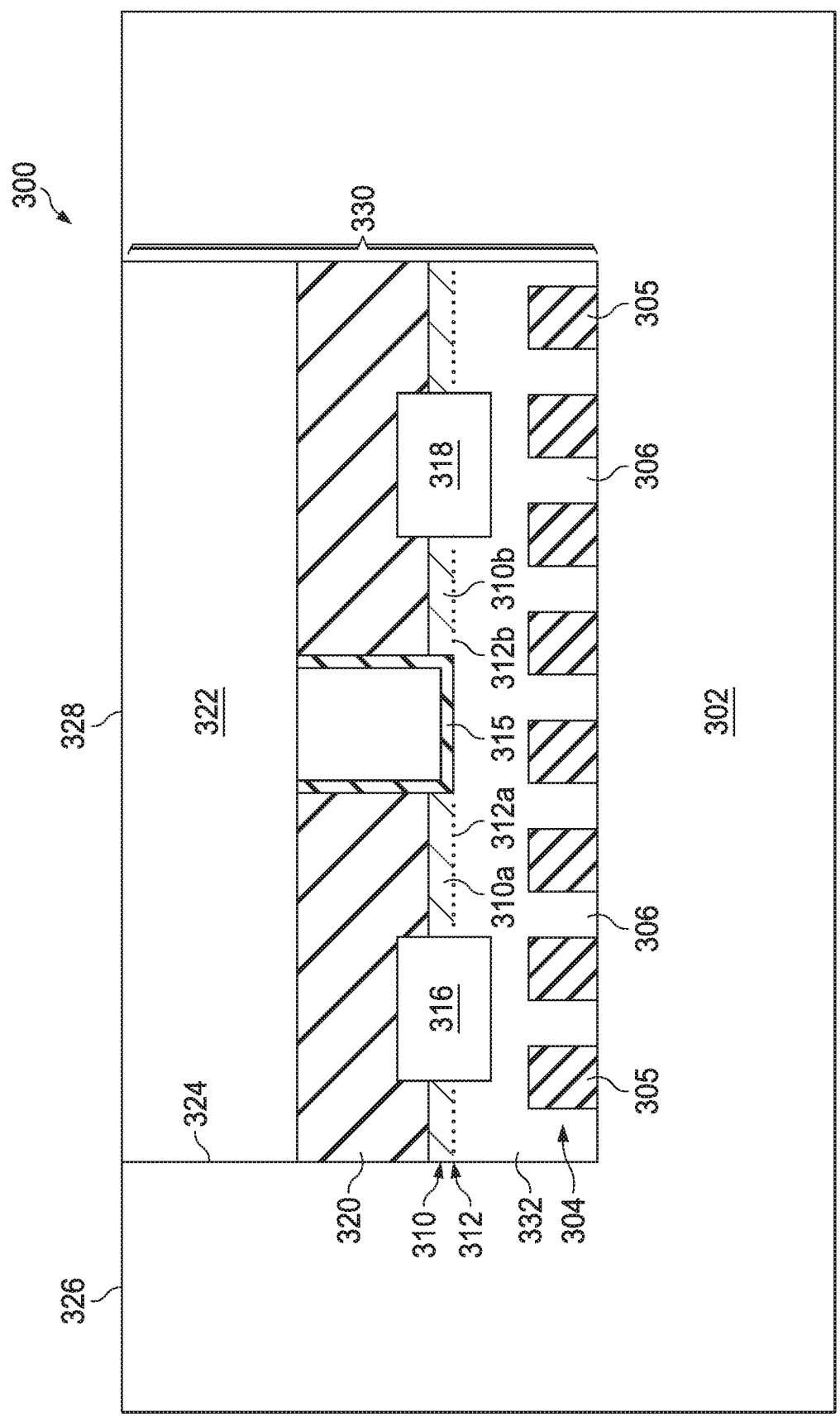
FIG. 3 is a schematic illustration of a gallium nitride transistor formed on a silicon 111 substrate in accordance with embodiments of the present disclosure.

FIG. 3 is a schematic illustration of a gallium nitride transistor 300 formed on a silicon 111 substrate 302 in accordance with embodiments of the present disclosure. The silicon (Si) 111 substrate 302 includes a trench 330 etched into the substrate 302 (shown in more detail in FIG. 5A. The trench 330 can include a trench surface 332 and sidewall 324. The trench 330 has a sidewall 324 that has a 110 crystalline orientation. FIG. 3 shows the 11-2 crystalline orientation "into the page." The silicon 111 substrate 302 can include a top side 326 that can be considered the top of the substrate. The substrate crystalline orientation as shown in FIG. 3—and the orientation of the GaN transistor features relative to the substrate's crystalline orientation—facilitate the formation of silicon PMOS devices on the top side 326 and on the polysilicon 322. The silicon PMOS devices and the GaN NMOS can together form a hybrid CMOS device for RF and PA applications.

The GaN transistor 300 includes a GaN layer 308 grown from the trench surface 332. In some embodiments, a shallow trench isolation (STI) layer 304. The STI layer 304 includes a plurality of oxide islands 305. Each of the oxide islands 305 are separated by a trench 306. The GaN layer 308 is formed epitaxially in the trenches 306 (in some embodiments, from a seed layer to facilitate epitaxial growth).

A polarization layer 310 can be formed on the GaN layer 308. The polarization layer 310 can include aluminum+nitride alloy, such as aluminum indium nitride ($Al_xIn_{1-x}N$) or aluminum gallium nitride ($Al_xGa_{1-x}N$). Part of the polarization layer 310 can include an intermediate layer of aluminum nitride (AlN) that can be deposited on the GaN layer to help facilitate the formation of the remainder of the polarization layer and to further support mobility in the resulting channel. A conductive channel 312 is formed at the interface of the polarization layer 310 and the GaN layer 308. The conductive channel 312 can be a two-dimensional electron gas (2DEG) formed at the interface of the polarization layer 310 and the GaN layer 308.

A gate electrode 314 can be formed from etching through the polarization layer to expose the GaN layer 308 (or the intermediate AlN layer). A metal electrode can be deposited on the exposed GaN layer 308. Similarly, a metal source electrode 316 and a metal drain electrode 318 can be deposited in an exposed GaN layer region. The polarization layer portion 310a between the source 316 and the gate 314 is isolated because of the etching of the polarization material to expose the underlying GaN layer 308. The resulting conductive channel 312a would be at the interface of the GaN layer 308 and the polarization layer 310a between the source 316 and the gate 314. Similarly, the polarization layer portion 310b between the drain 318 and the gate 314 is isolated because of the etching of the polarization material to expose the underlying GaN layer 308. The resulting conductive channel 312b would be at the interface of the GaN layer 308 and the polarization layer 310b between the drain 318 and the gate 314. To the extent that the polarization layer 310 is segmented by the etching process (to form the gate, source, and drain), the disclosure refers to each segment as a polarization layer.

An oxide layer 320 is formed on the polarization layer 310 and the source 316, gate 314, and drain 318. A polysilicon layer 322 is formed on the oxide 320. A top portion 328 of the polysilicon 322 is coplanar with a top portion 326 of the silicon 111 substrate 302.

Figure 4:
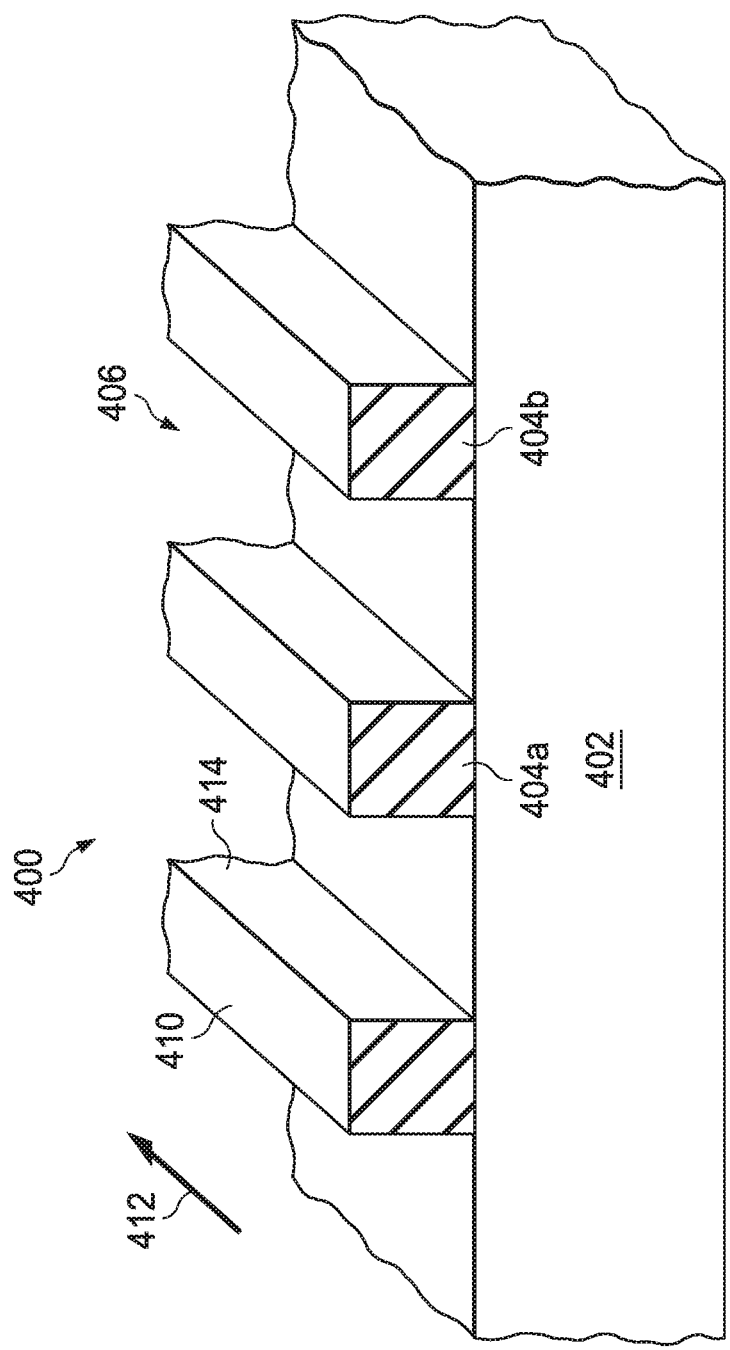
FIG. 4 is a schematic diagram of a perspective view of a silicon 111 substrate showing crystal structure directions in accordance with embodiments of the present disclosure.

FIG. 4 is a schematic diagram of a perspective view 400 of a silicon 111 substrate 402 showing crystalline orientation directions in accordance with embodiments of the present disclosure. The perspective view 400 shows the crystalline orientations for the silicon 111 substrate and the relative orientations of the STI oxide islands 404a and 404b. The STI oxide islands 404a are formed from the silicon 111 substrate with a long axis in the [11-2] direction. The STI trench 406 separates each STI oxide island. The GaN NMOS transistor can be grown in the STI trench 406 as described in FIG. 3 and FIGS. 5A-5C.

A silicon 111 island would have a (110) sidewall 414 and can be formed in the [11-2] direction 412. The silicon topside 410 would reflect the 111 substrate orientation.

Figure 5A:
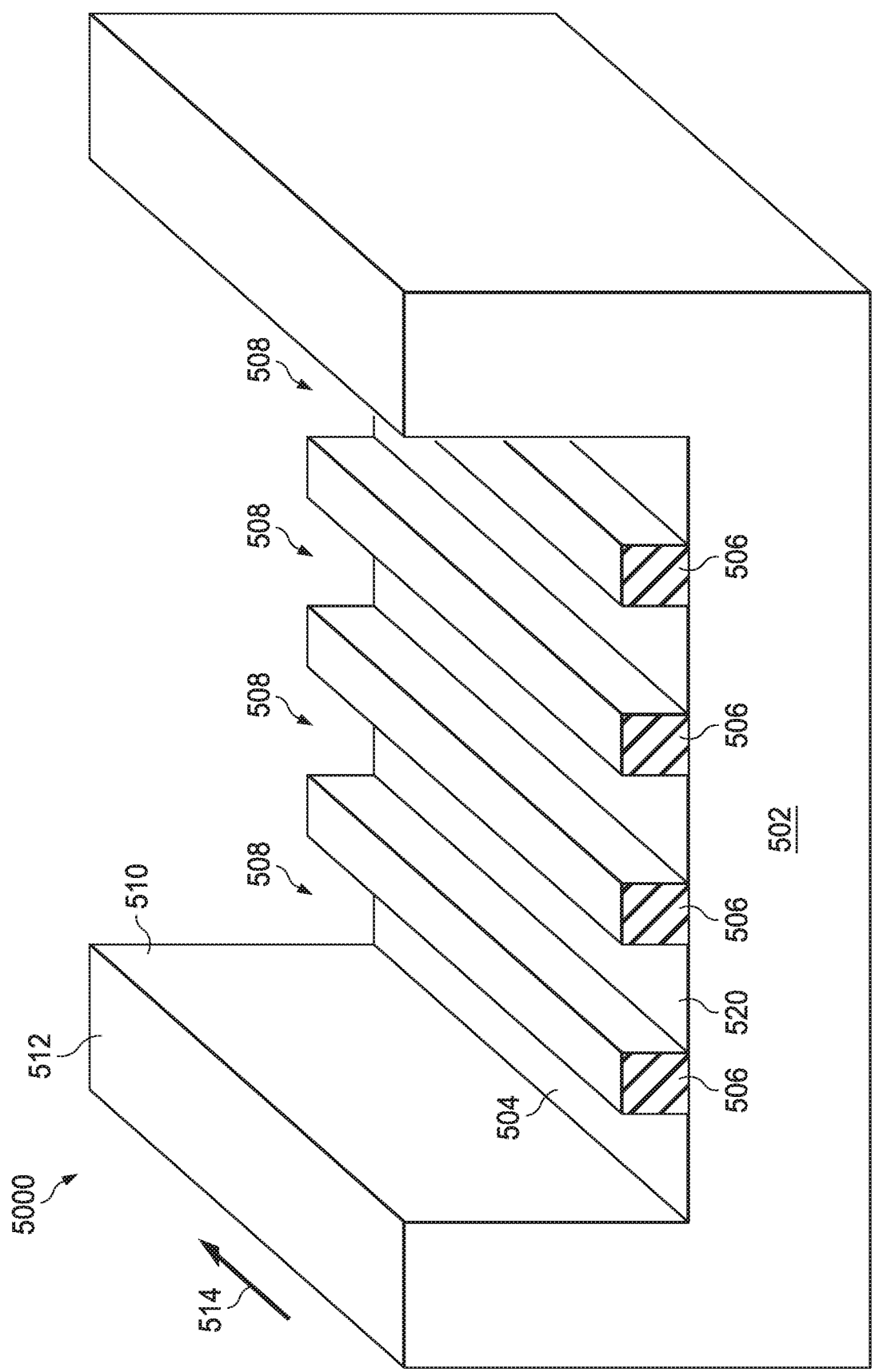
FIG. 5A-5F are schematic diagrams for forming a gallium nitride transistor on a silicon 111 substrate in accordance with embodiments of the present disclosure.

FIG. 5A-5F are schematic diagrams for forming a gallium nitride transistor on a silicon 111 substrate 502 in accordance with embodiments of the present disclosure. FIG. 5A shows the formation 5000 of shallow trench isolation (STI) oxide islands 506. The silicon 111 substrate 502 can be etched to form a substrate trench 504. The STI oxide islands can be patterned and deposited to form islands having a long axis in the (11-2) crystalline direction 514. Each oxide island 506 is separated from its nearest neighbor by a STI trench 508. The oxide islands 506 and STI trenches 508 can be referred to as an STI layer.

The sidewall of the trench 504 is a silicon 110 sidewall 510. The topside 512 is the (111) direction.

Figure 5B:
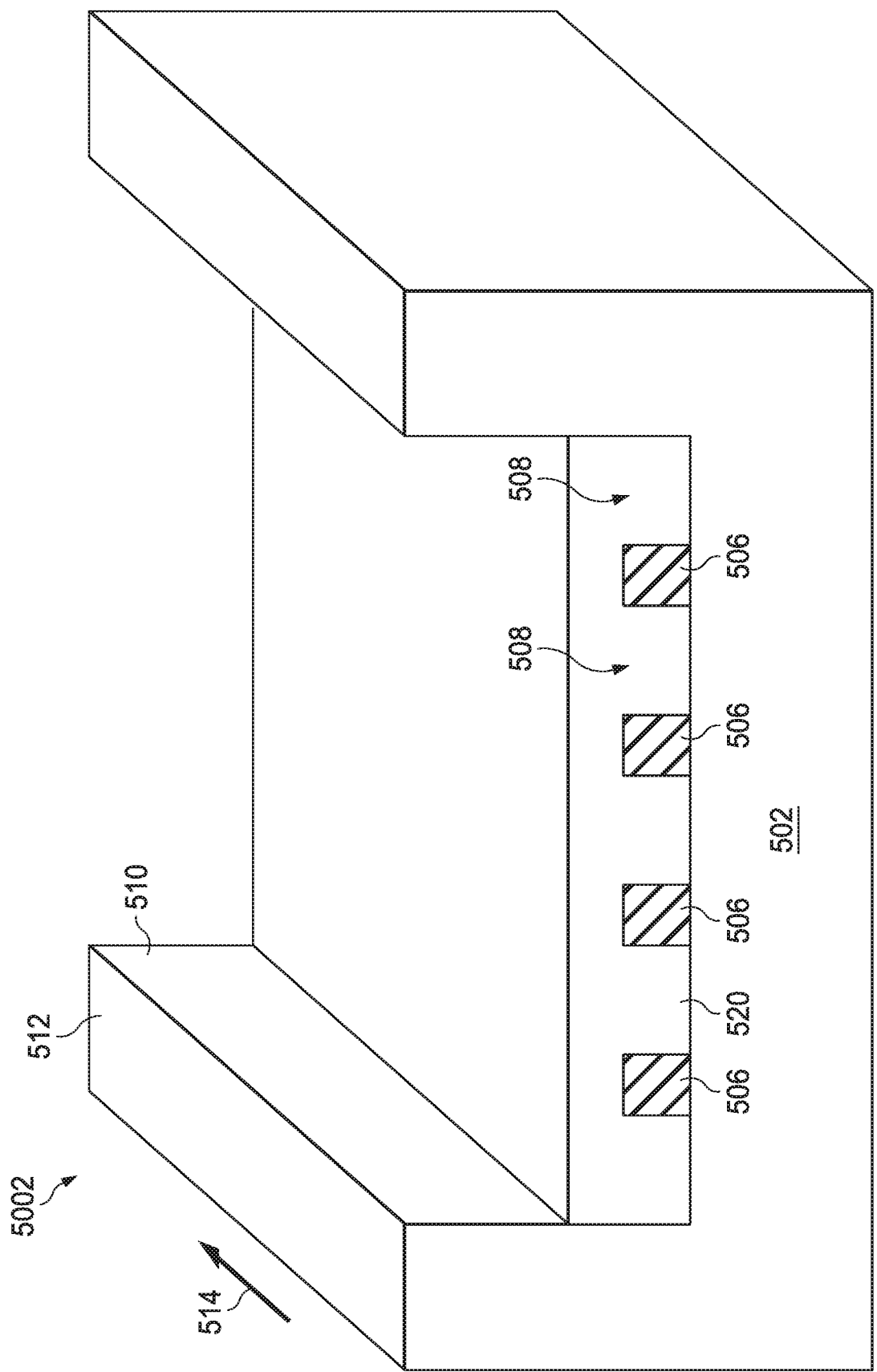

FIG. 5B shows the formation 5002 of the gallium nitride layer 520. The GaN layer 520 can be formed in the substrate trench—and more specifically, from the STI trenches between the STI oxide islands.

Figure 5C:
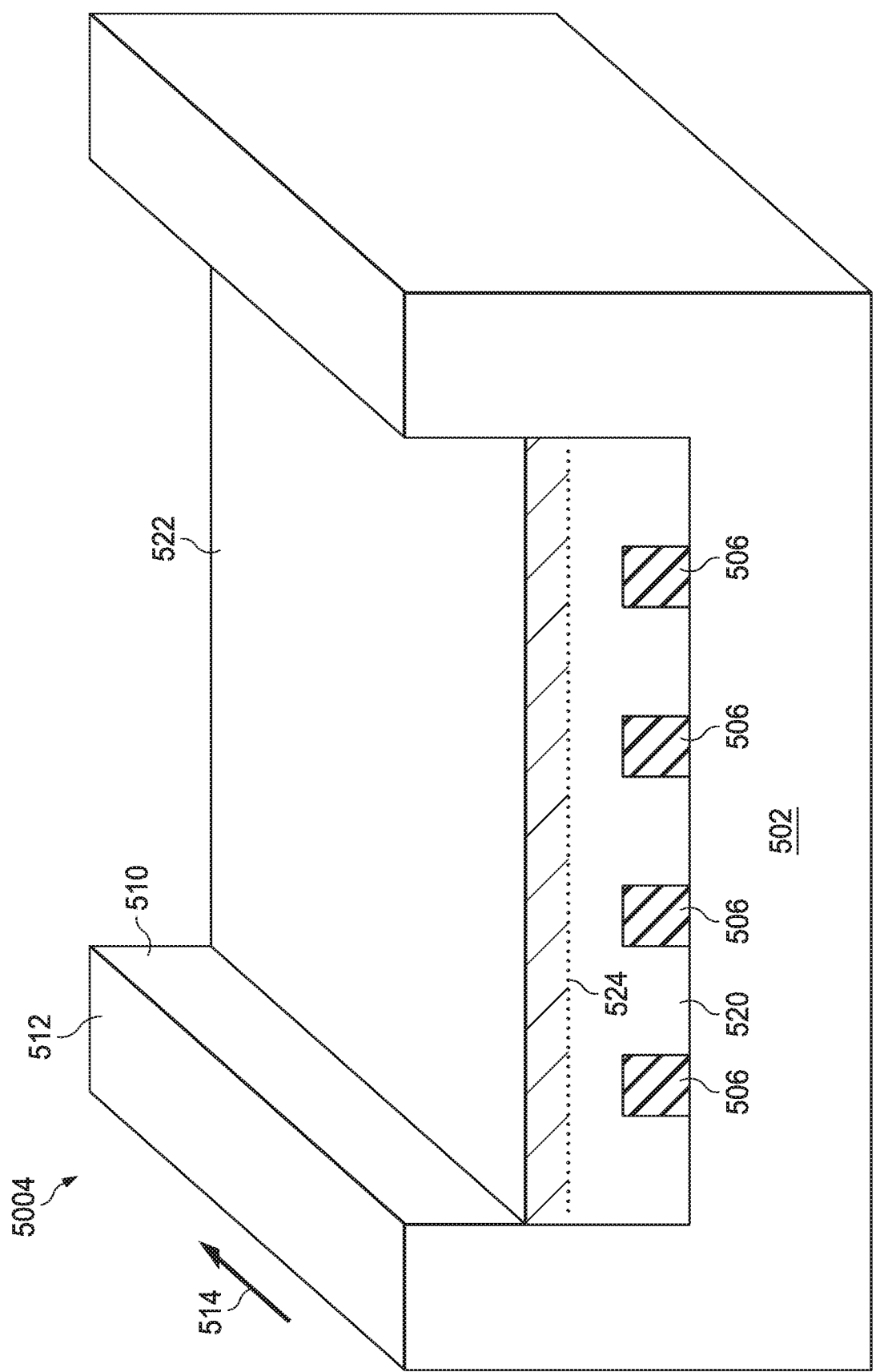

FIG. 5C shows the formation 5004 of the polarization layer 522. The formation of the polarization layer 522 can include an initial deposition of aluminum nitride as a seed layer. A layer of aluminum indium nitride ($Al_xIn_{1-x}N$) or aluminum gallium nitride ($Al_xGa_{1-x}N$) can be deposited onto the seed layer to form the remainder of the polarization layer 522. The seed layer of AlN, if used, can also promote mobility of conductive elements in the conductive channel 524 formed at the interface between the polarization layer 522 and the GaN layer 520.

Figure 5D:
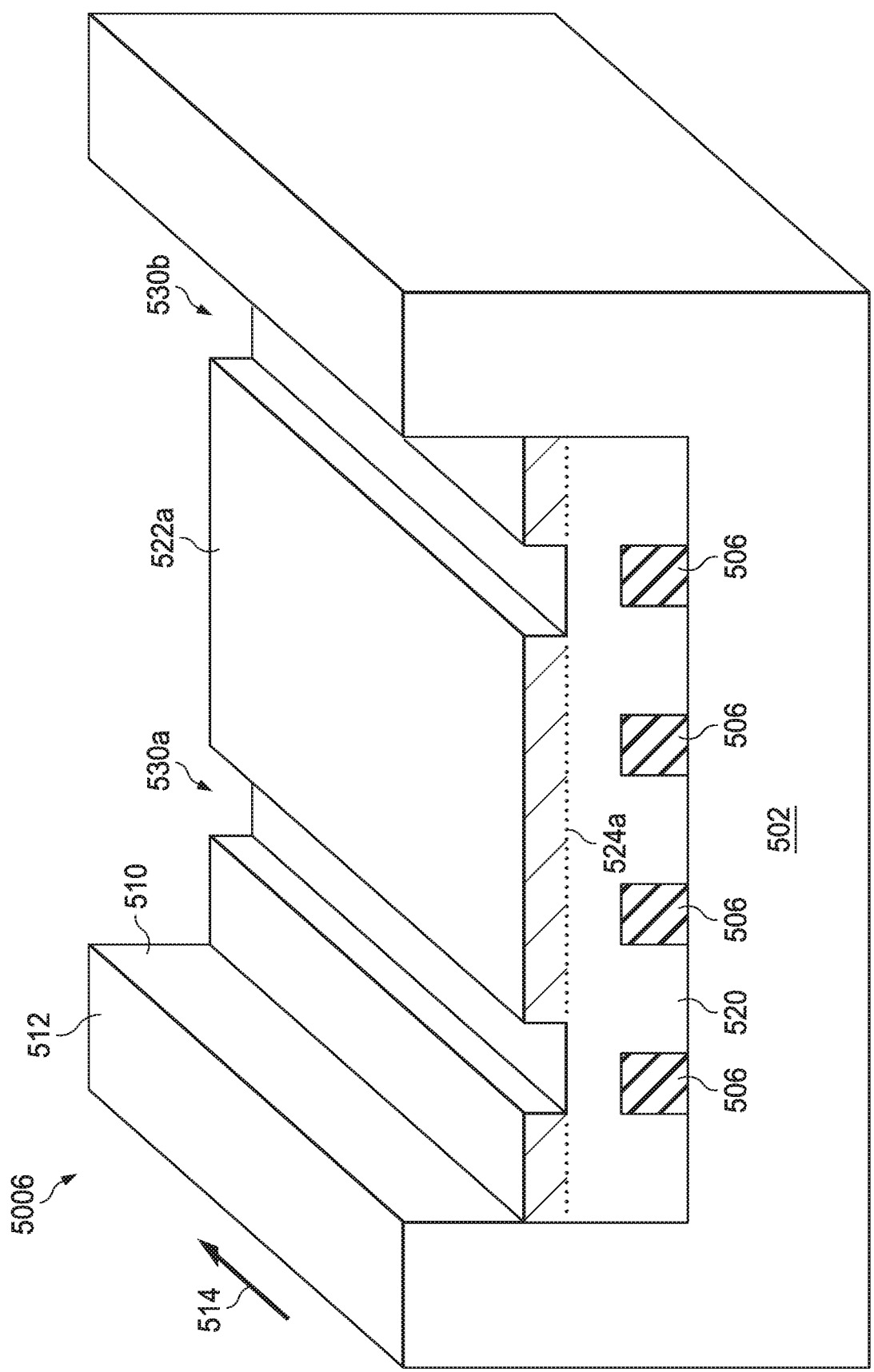
Figure 5E:
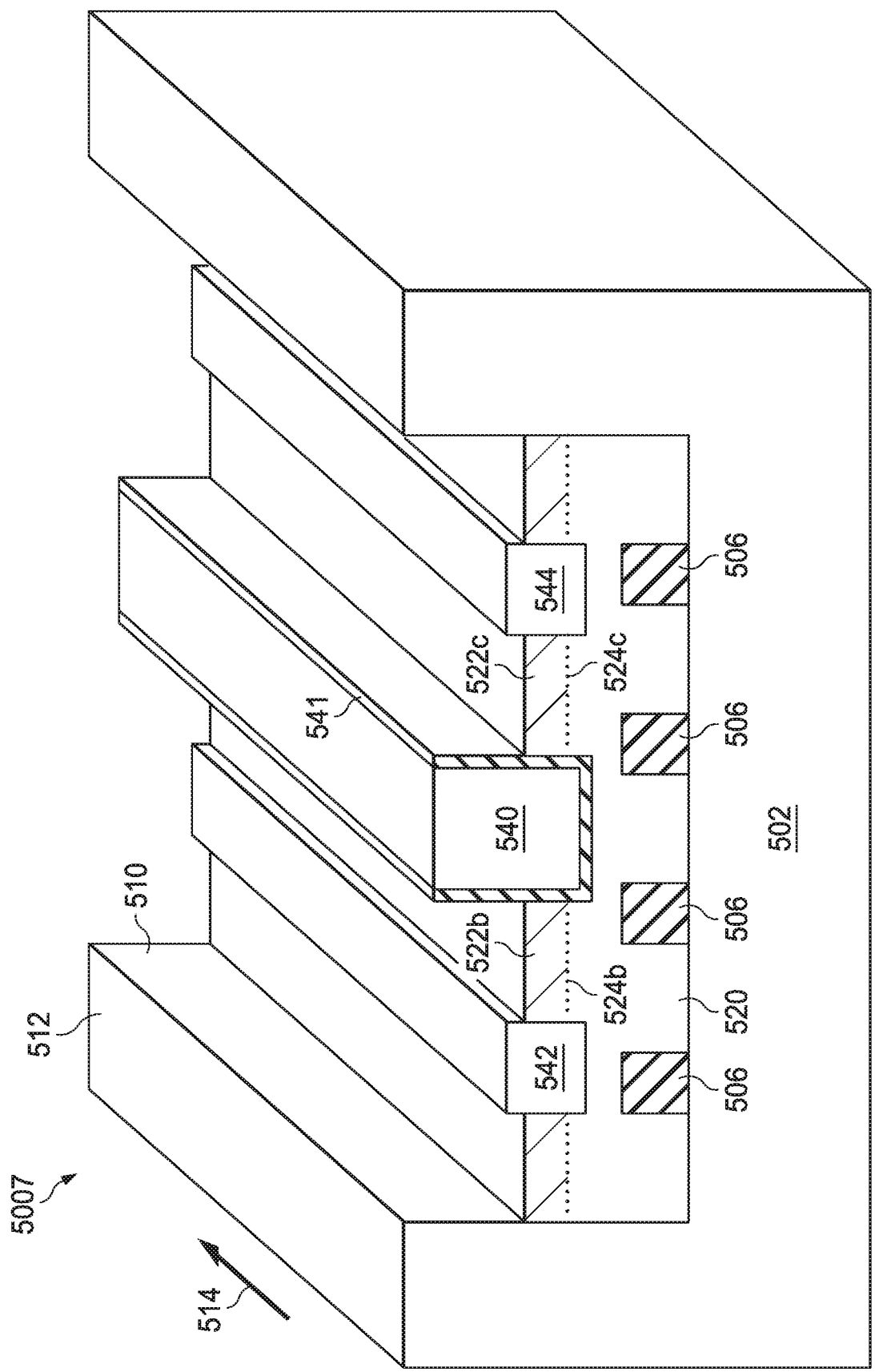

FIG. 5D-5E shows the formation 5006 of the gate, source, and drain. In FIG. 5D, the polarization layer is etched to reveal the GaN layer 520. For example, the GaN layer can be exposed as trenches 530a and 530b. The trenches 530a-b isolate the polarization portion 522a from other portions of the polarization layer. As described below, the source/drain can be formed in the trench 530a/530b, respectively. The removal of portions of the polarization layer 524 results in isolated conductive channel 524a.

FIG. 5E shows the formation 5007 the gate, source, and drain electrodes. The gate electrode 540 can be deposited using patterned deposition. Similarly, the drain electrode 542 and the source electrode 544 can be deposited using patterned deposition. The electrode metals can include titanium, tungsten, or other metal. The long axis of the electrodes is in a direction parallel to the Si 11-2 direction 514.

In some embodiments, the source and drain materials are deposited first. Then, a passivation layer can be deposited to protect the source and drain materials and to facilitate patterned etching of the polarization layer for the gate electrode. A gate dielectric (e.g., high-k dielectric) 541 is deposited into the gate trench. The gate electrode 540 can be deposited on the high-k dielectric 541.

Figure 5F:
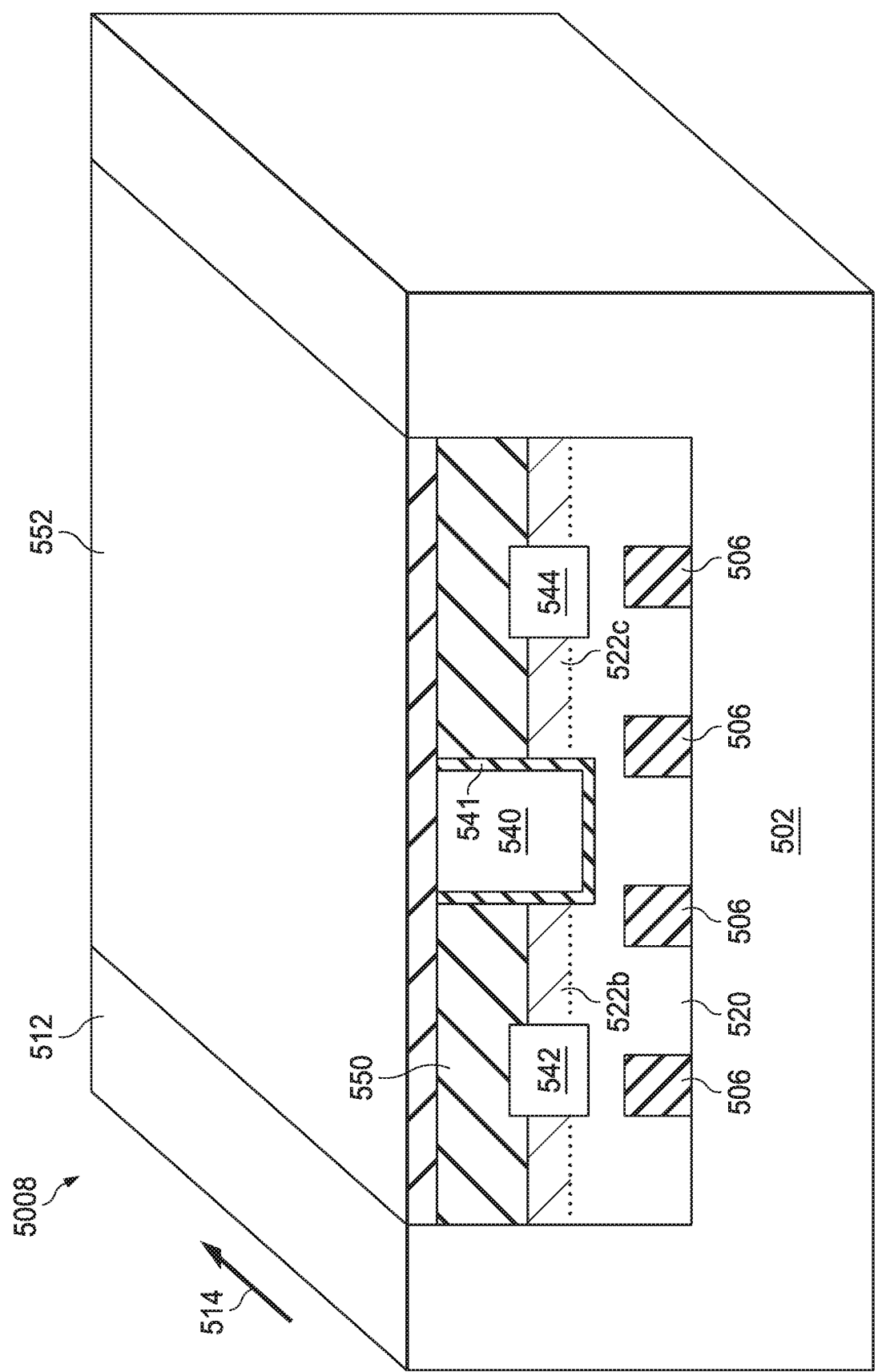

FIG. 5F shows the formation 5008 of the oxide layer 550 on the electrodes 540, 542, and 544, and on the polarization layer. The oxide can be deposited using known techniques for forming an oxide layer. A silicon layer 552 can be formed on the oxide 550. The silicon layer 552 may be formed of crystalline silicon, polycrystalline silicon, or a combination of both crystalline and polycrystalline silicon that is formed using known techniques. The silicon 552 can undergo a planarization process to planarize the silicon to be coplanar with the topside 512 of the silicon 111 substrate 502. For purposes of this discussion the silicon layer 552 will be referred to herein as a polysilicon layer 552, but it is understood that in alternate embodiments the silicon layer 552 may be a crystalline silicon layer or a layer that includes both crystalline and polycrystalline silicon.

Figure 6A:
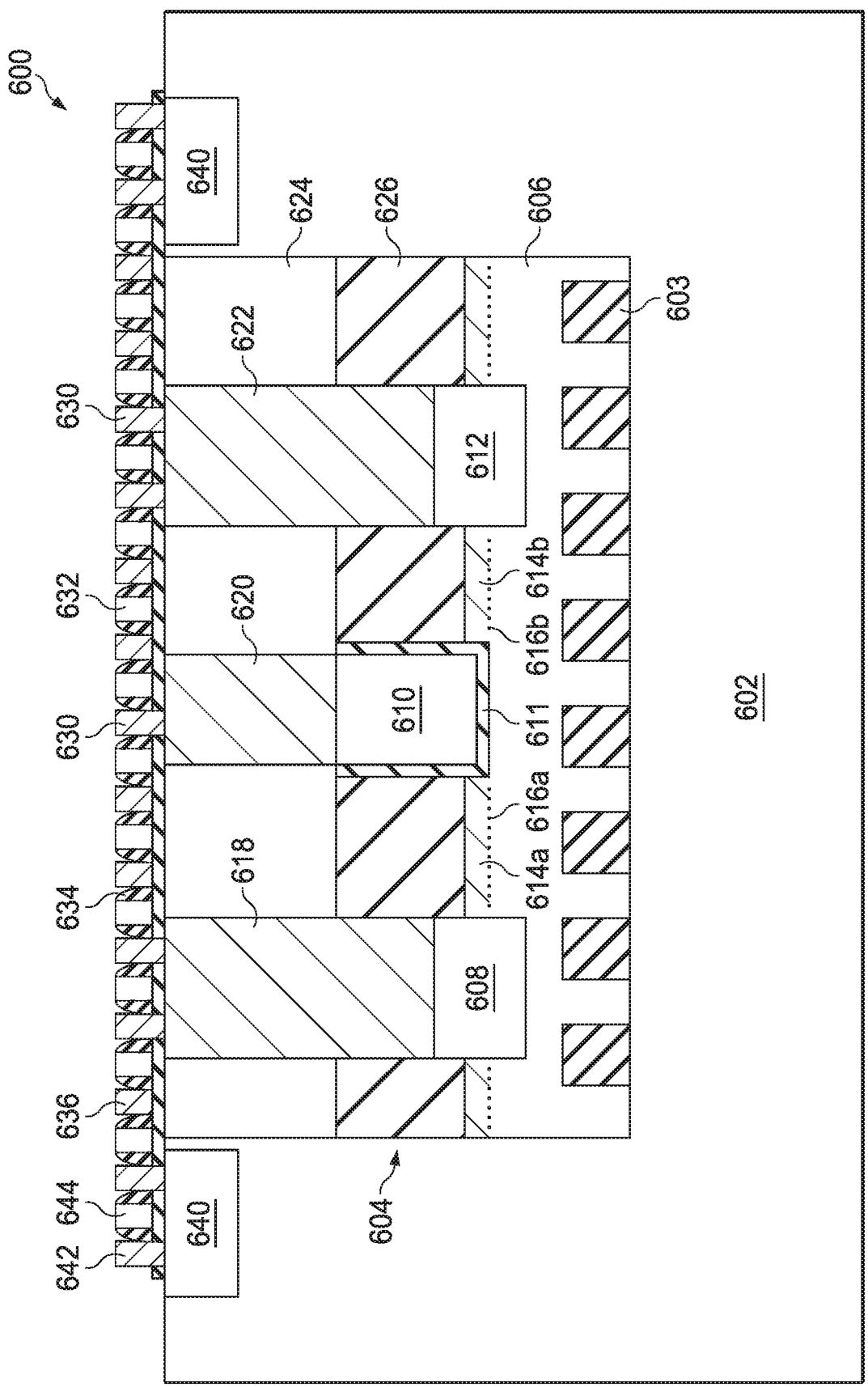
FIG. 6A is a schematic diagram of a cross sectional view of a gallium nitride NMOS transistor on a silicon substrate and two silicon PMOS transistors formed on the same silicon substrate.

FIG. 6A is a schematic diagram of a complementary metal oxide semiconductor (CMOS) transistor that includes a silicon p-type MOS (PMOS) transistor and a gallium nitride n-type MOS (NMOS) transistor. The CMOS 600 includes a silicon 111 substrate 602, which is shown having a 11-2 orientation into the page and a 110 sidewall. The GaN transistor 604 is similar to that shown in FIG. 3, including the polysilicon 624 and the oxide 626. The GaN transistor 604 includes a metal fill 618 formed in a gap formed in the polysilicon 624 and the oxide 626. The metal fill 618 resides on the source 608, a metal fill 620 formed on the gate 610, and a metal fill 622 formed on the drain 612. The gate 610 can be formed on a high-k dielectric 611 on the GaN layer 606.

The metal fill can facilitate contact of the source, gate, and drain from a topside of the substrate 602 through one or more trench contacts (TCs). For the GaN NMOS 604, the TCs are for contacting the GaN NMOS, and can be referred to as TCNs. An example TCN is shown in FIG. 6A as TCN 630. The TCN 630 can include titanium or tungsten. Adjacent to each trench contact 630 is a polysilicon structure 632. The polysilicon structure 632 includes spacers 634 on either side of the polysilicon structure 632 to isolate each trench contact. Additionally, one or more trench contacts can be blanks 636. In some embodiments, the polysilicon structure 632 can include a replacement metal gate (RMG) polysilicon.

Trench contacts can also be formed on the silicon 111 topside. A polysilicon structure 644 can be formed between two trench contacts 642. The polysilicon structure 644 can be an RMG polysilicon in some embodiments. The trench contacts (TCPs) 642 formed on the silicon 111 and the polysilicon 644 can form a PMOS transistor 640. The polysilicon 644 can act as a temporary place holder for a gate for the PMOS 640.

The PMOS 640 can be formed adjacent to the GaN NMOS by forming source/drain electrodes and a gate electrode. The source and drain can be formed in the substrate 602. For example, the substrate 602 can be selectively doped. In some embodiments, the substrate 602 can be etched and filled via epitaxial deposition of a source/drain material, such as a silicon germanium). The trench contacts 640 can connect the source/drain formed in the substrate 602 to metallization layers.

The polysilicon can be removed during the replacement metal gate (RMG) flow and replaced with a new high-k gate dielectric and a metal gate electrode, which can have multiple layers such as a work function layer and a fill layer.

The GaN NMOS 600 also includes a polarization layer 614a on the GaN layer 606. The polarization layer 614a on the GaN layer forms a conductive channel (e.g., a 2DEG) 616a between the source electrode 608 and the gate electrode 610. The polarization layer 614b on the GaN layer 606 forms a conductive channel 614b between the drain electrode 612 and the gate electrode 610.

Figure 6B:
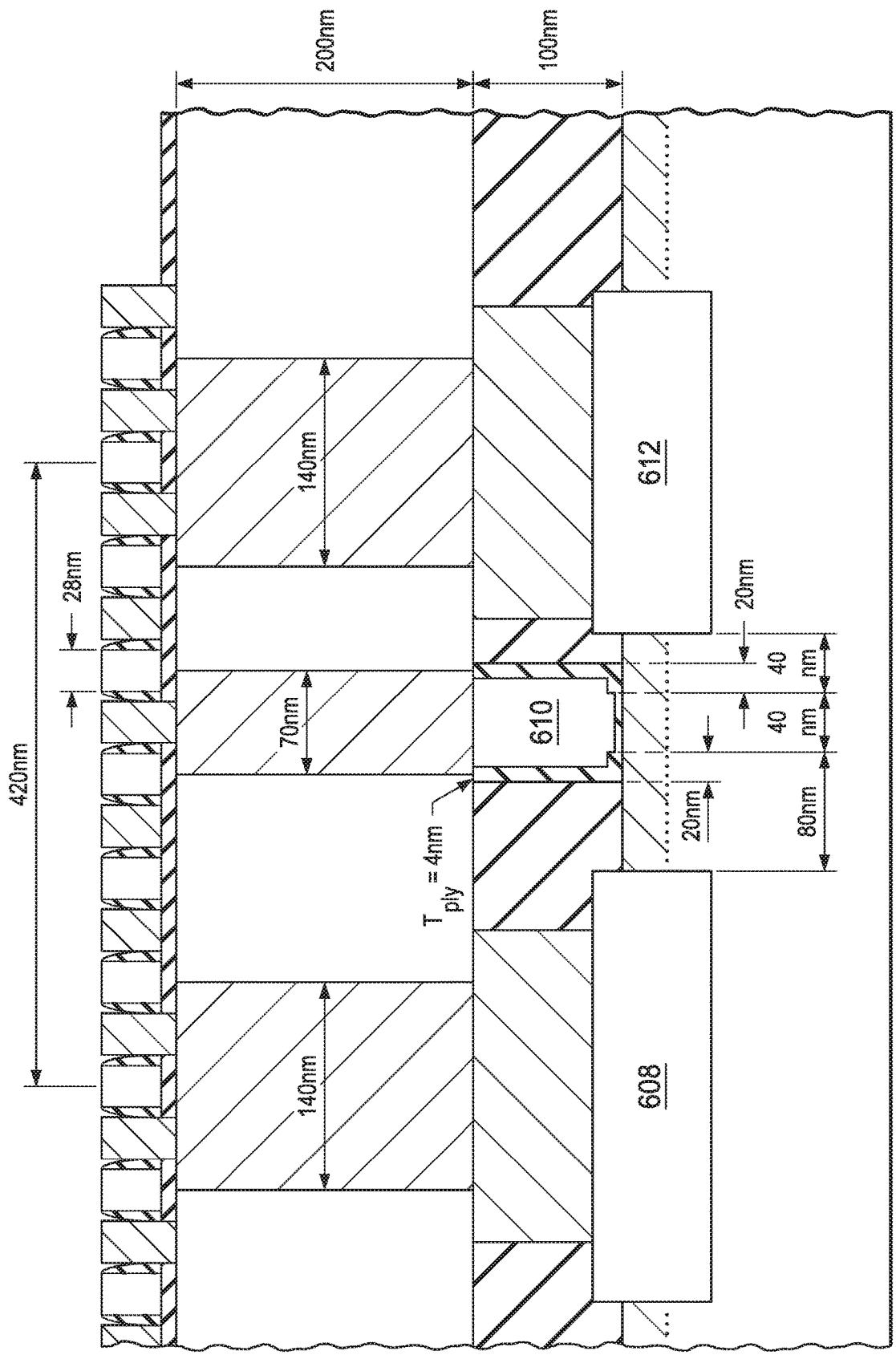
FIG. 6B is a schematic diagram of a cross sectional view of the gallium nitride NMOS transistor of FIG. 6A showing example features sizes.

FIG. 6B is a schematic diagram of a GaN NMOS showing feature dimensions. The features of the CMOS shown in FIG. 6B can conform to certain feature sizes. For example, the metal vias for the source and drain can be on the order of 140 nm (e.g., within a range from 130 to 150 nm). The metal via for the gate can be on the order of 70 nm (e.g., within a range from 60 to 80 nm). The NMOS transistor pitch can be on the order of 420 nm (e.g., within a range from 400 to 440 nm). The gate can be on the order of 80 nm (e.g., within a range from 70 to 90 nm). The channel length between the drain and the gate can be on the order of 80 nm (e.g., within a range from 70 to 90 nm); the channel length between the source and the gate can be on the order of 40 nm (e.g., within a range from 30 to 50 nm). The oxide thickness can be on the order of 100 nm (e.g., within a range from 85 to 115 nm). The polysilicon can be on the order of 200 nm (e.g., within a range from 180 to 220 nm). The polysilicon structures, such as polysilicon structures 632 or 644 can have a width on the order of 28 nm (e.g., within a range from 20 to 40 nm). More generally, the various structure dimensions can be formed to be multiples of each other so that pitch lengths, feature depths, etc., can be maintained across the entire wafer.

FIG. 6C is a schematic diagram of a cross section view of a silicon transistor formed adjacent to the gallium nitride NMOS transistor of FIG. 6A in accordance with embodiments of the present disclosure. The silicon transistor 640 includes a P+ region 662 and a P+ region 664, which can act as a source and drain, respectively. The P+ regions can be formed through implant and anneal processing or through etching and epitaxial deposition or through other known techniques. The silicon transistor 640 also includes a gate electrode 668. Gate electrode 668 resides on a high-k dielectric 650. Spacers 670 can be formed on the sidewall of the gate metal 668 to isolate the gate metal 668 from the source/drain TCN 648.

Figure 7A:
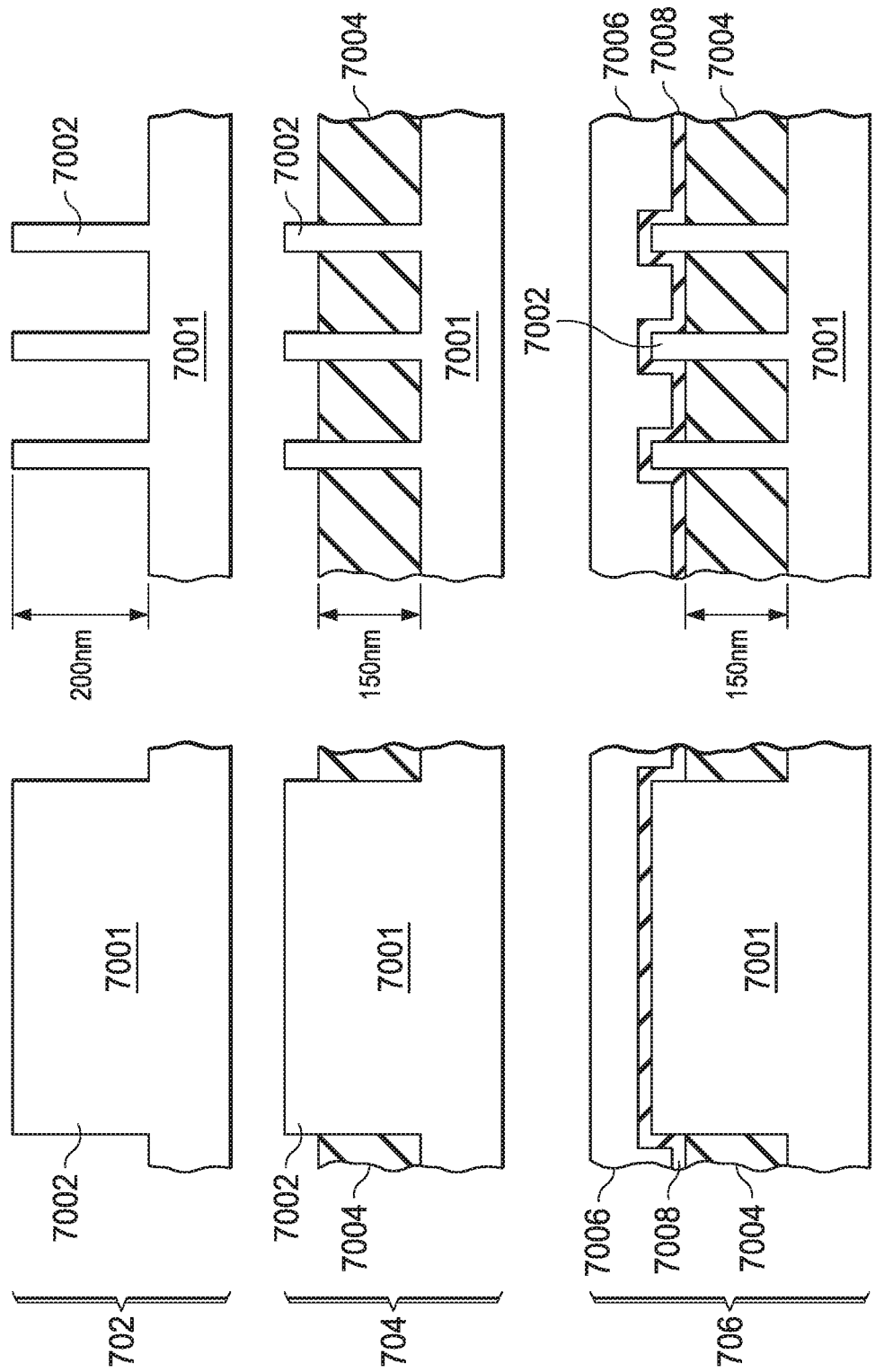
FIG. 7A-7C are schematic diagrams for forming trench contacts for the gallium nitride transistor and for forming trench contacts to form a silicon PMOS transistor.
Figure 7B:
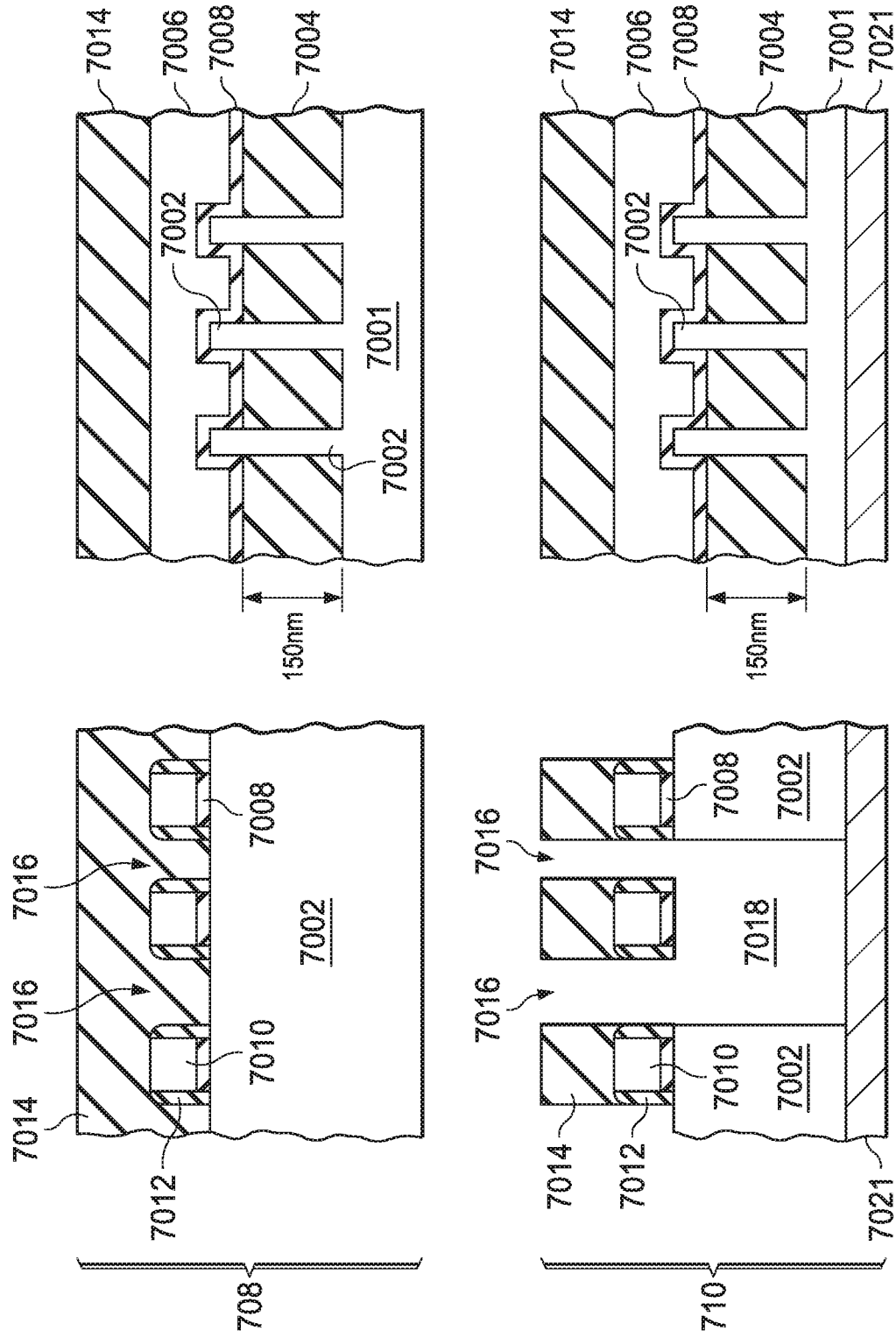
Figure 7C:
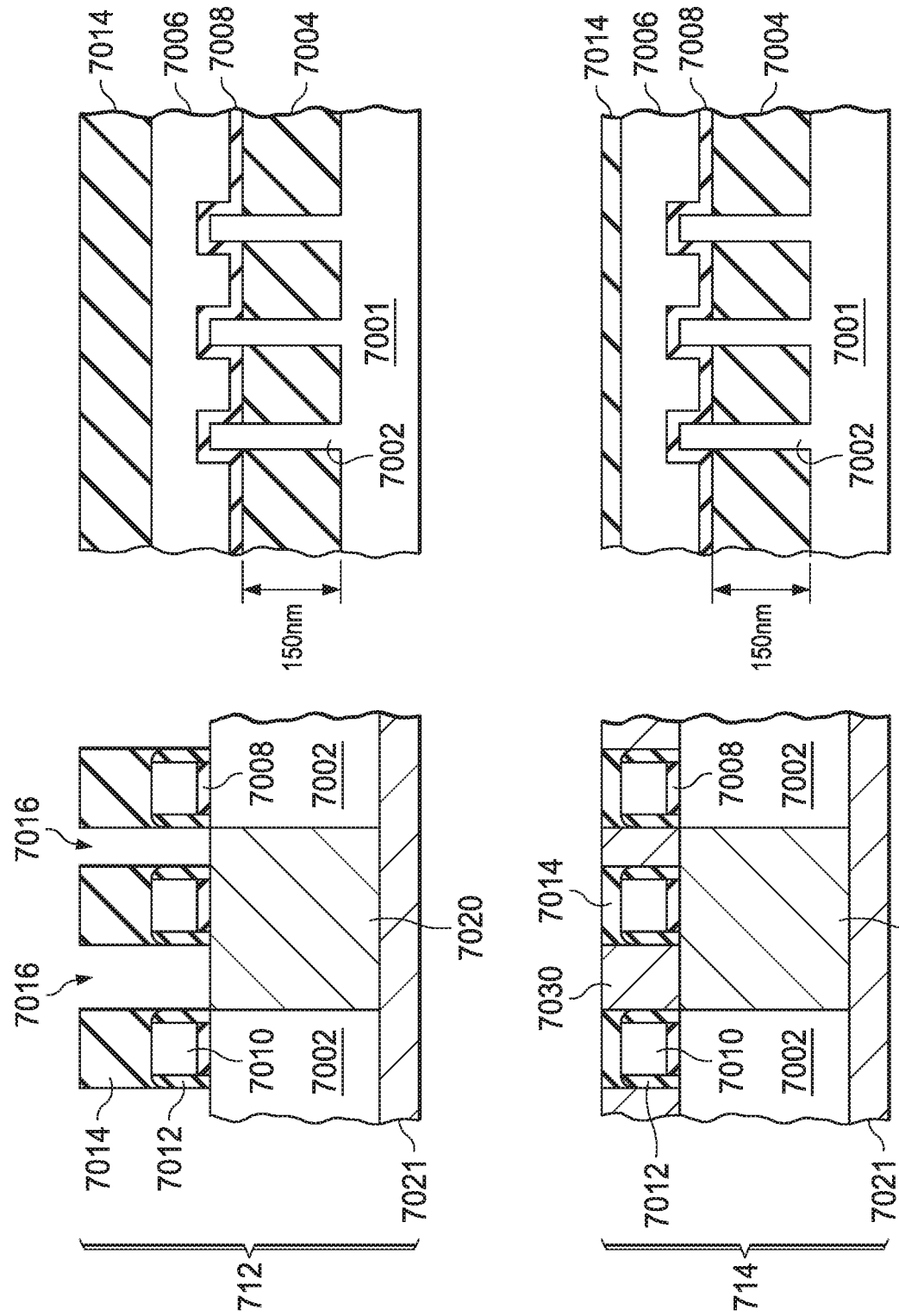

FIGS. 7A-7C are schematic diagrams for a process flow for forming trench contacts on the polysilicon for the gallium nitride transistor. The trench contacts are formed on the silicon at the same time, which forms the silicon PMOS transistors. FIGS. 7A-7C shows a side-by-side view of the formation process. The view on the right shows a side view of the view on the left, as shown by the dotted arrow. FIG. 7A are process flow diagrams for forming a polysilicon fin and forming a replacement metal gate layer on the polysilicon fin. The polysilicon 7001 is etched to form a fin 7002 (702). The polysilicon can be etched by a semiconductor processing technique. The fin 7002 can be formed to a height on the order of 200 nm. The gaps between the fins can be filled with an oxide 7004 (704). The oxide can be formed to a predetermined height and etched down so that a certain amount of the polysilicon fin is exposed above the oxide 7004. For example, the oxide 7004 can be etched to a height on the order of 150 nm (e.g., within a range from 125 to 175 nm) so that a portion (e.g., within a range from 35 to 65 nm) of the polysilicon fin 7002 is exposed from the oxide 7004.

A polysilicon layer 7006 is formed on the fins 7002 and exposed oxide 7004 (706). The polysilicon structure can be a replacement metal gate polysilicon, in some embodiments. In some embodiments, a high-k dielectric 7008 is deposited on the exposed polysilicon fins 7002 and the oxide 7004, and the polysilicon 7006 is formed on the high-k dielectric 7008.

FIG. 7B is a schematic diagram for a process flow for forming trench contacts on the polysilicon for the gallium nitride transistor. The polysilicon layer 7006 can be patterned to form polysilicon structures 7010 and to create trenches 7016 that expose the underlying polysilicon 7002 (708). The patterning of the polysilicon 7006 also forms structures that can serve as gate electrodes for the silicon PMOS. Insulating spacers 7012, such as oxide-based spacers are formed in the exposed trenches between polysilicon islands 7006. The spacers are formed in the trenches 7016, and are etched so that the polysilicon layer 7002 is exposed but the polysilicon islands 7010 are isolated from the trenches 7016. The trenches 7016 and the islands 7010 are covered with an oxide 7014.

The oxide 7014 and the underlying polysilicon 7002 and any underlying oxide can be selectively etched to form a gap 7018 for the GaN transistor source, drain, and gate electrodes 7020 (710).

FIG. 7C is a schematic diagram for a process flow for forming trench contacts on the polysilicon for the gallium nitride transistor. A metal 7021 is deposited in the gap 7018 (from FIG. 7B) to create a metal via to contact the source, drain, or gate electrode (712). A trench contact metal is deposited into the gaps 7016 to form the trench contacts 7030 (714). In some embodiments, blanks are created by selectively etching oxide above source, drain, and gate locations of the GaN transistor but leaving the oxide above some areas.

Figure 8A:
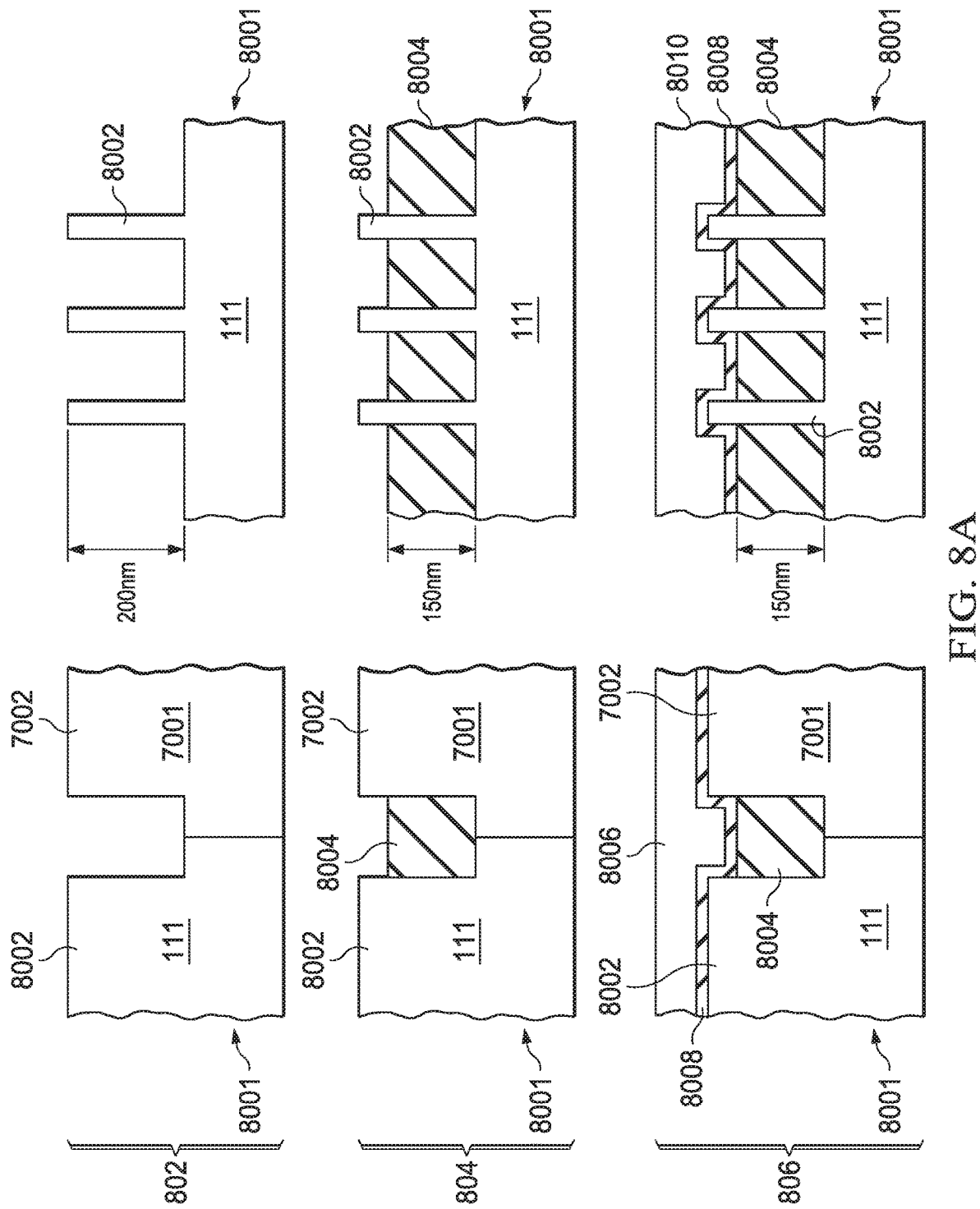
FIGS. 8A-8D are schematic diagrams for a process flow for forming trench contacts on silicon 111 for the silicon transistor.
Figure 8B:
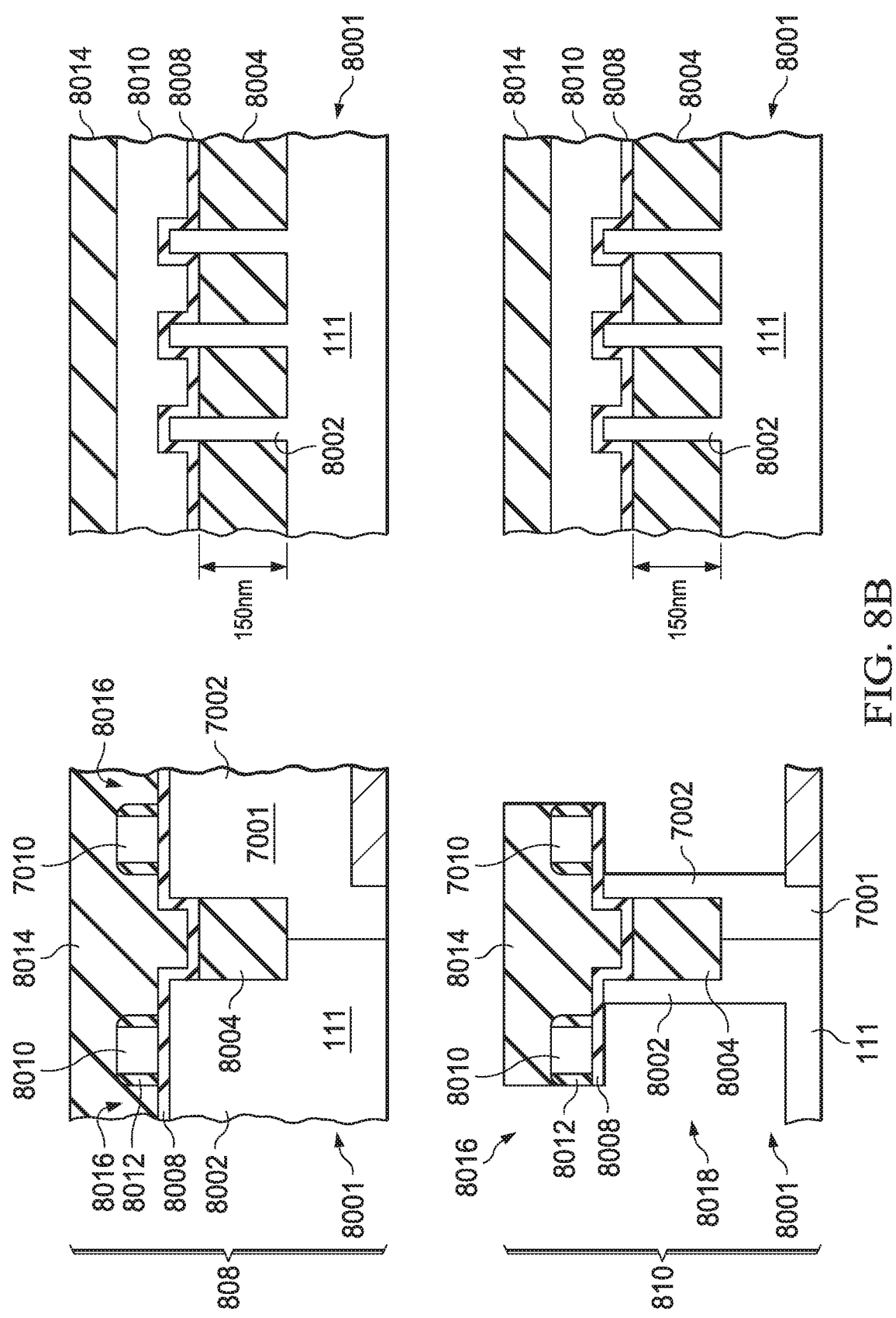
Figure 8C:
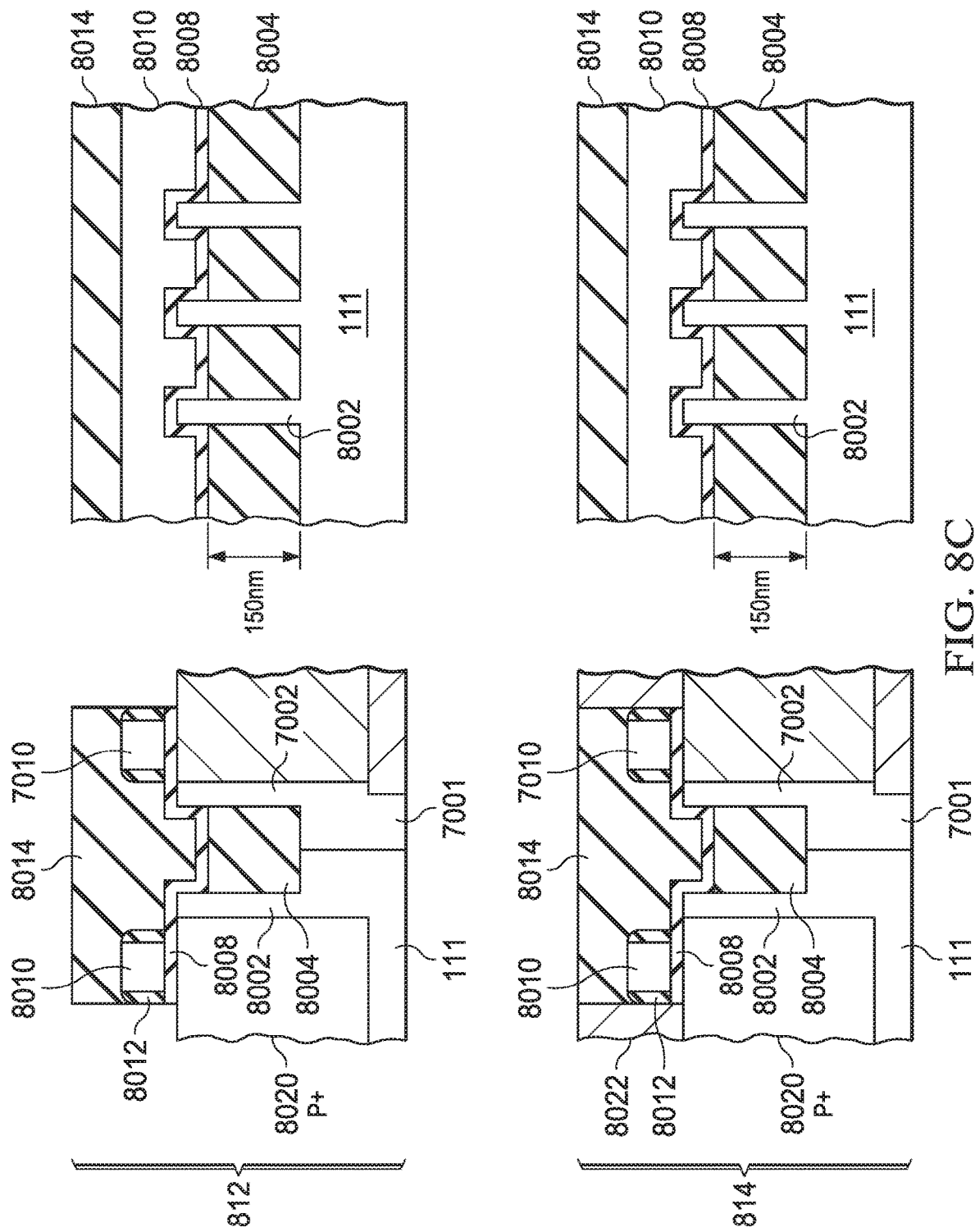

FIGS. 8A-8D are schematic diagrams for a process flow for forming trench contacts on silicon 111 for the silicon transistor. The trench contacts are formed on the silicon at the same time as on the polysilicon islands over the GaN transistor. FIGS. 8A-8C shows a side-by-side view of the formation process. FIG. 8A is a schematic process flow diagram showing processing of polysilicon islands over a GaN transistor of FIG. 3 and processing of the silicon 111 substrate 8001 to form a PMOS device. The view on the right side of the page shows a side view of the image on the left side of the page, as shown by the dotted arrow. The polysilicon can be etched to form a fin 7002. Likewise, the silicon 111 substrate 8001 can be etched to form a fin 8002 (802). In some embodiments, an oxide 8004 (such as silicon dioxide) can be deposited as a passivation layer (804) between the silicon 111 fin 8002 and the polysilicon fin 7002. The oxide 8004 can also be deposited between silicon 111 fins. A polysilicon layer 8006 can be deposited over the fin 8002 and the oxide 8004 (806). In some embodiments, a high-k dielectric 8008 can be deposited over the fin 8002 prior to depositing the polysilicon layer 8006.

Turning to FIG. 8B, FIG. 8B is a schematic process flow diagram for forming polysilicon islands and etching spaces in the silicon 111 for forming source and/or drain regions for the PMOS device. The polysilicon 8006 can be patterned to form polysilicon islands 8010 and to create trenches 8016 that expose the underlying polysilicon 8002 (808). Insulating spacers 8012, such as oxide-based spacers, are formed in the exposed trenches between polysilicon islands 8006. The spacers are formed in the trenches 8016, and are etched so that the polysilicon layer 8002 is exposed and the polysilicon islands 8010 are electrically isolated from the trenches 8016. The trenches 8016 and the islands 8010 are covered with an oxide 8014 (808).

The oxide 8014 and the underlying polysilicon 8002 and any underlying oxide can be selectively etched to form a gap 8018 (810).

FIG. 8C is a schematic process flow diagram for forming a PMOS source/drain region and forming trench contacts. After poly and oxide is removed (8018 in 810), the source/drain for the PMOS can be formed by forming a P+ region 8020 via implant and anneal for Si source/drain (812). The trench contact 8022 can be formed on the silicon P+ region (814). The source/drain for the PMOS are formed on either side of a polysilicon island, which is on a high-k dielectric 8008.

Figure 8D:
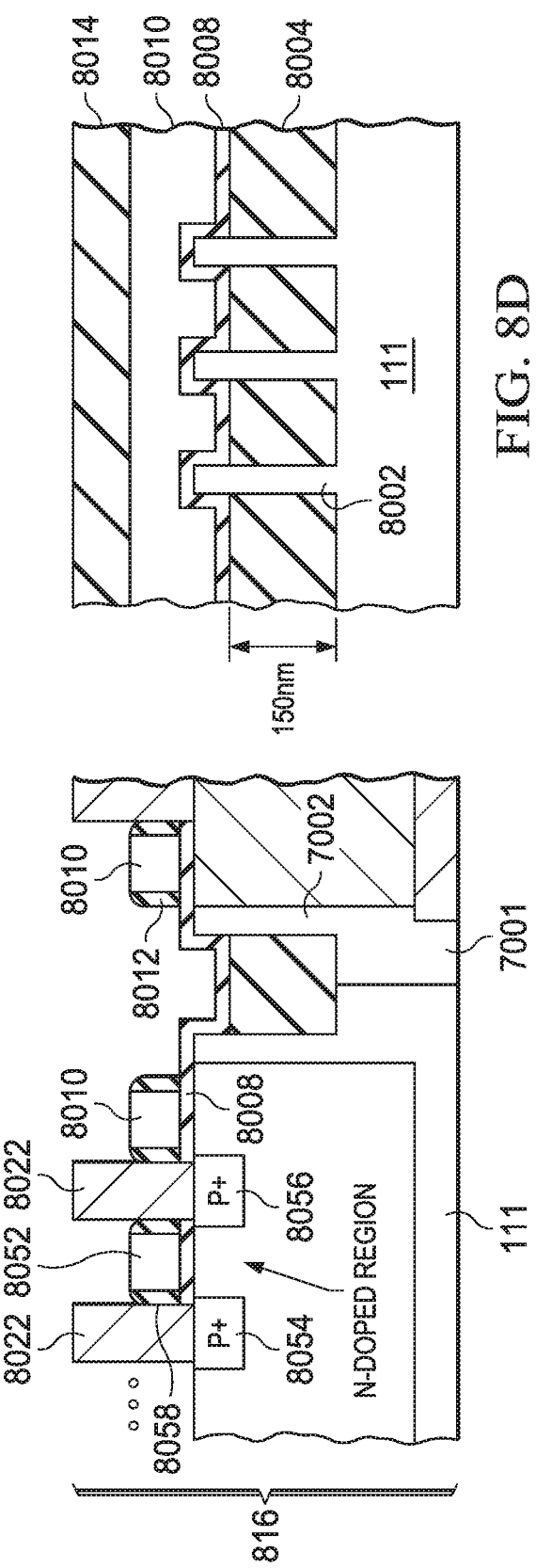

FIG. 8D is a schematic process diagram for forming a gate electrode for the PMOS transistor. Between the source 8054 and the drain 8056, a gate metal 8052 is deposited on the exposed dielectric material 8008 (816). The gate metal 8052 can include sidewalls. Non-conducting spacers 8058 can be formed on the sidewall of the gate metal 8052.

Figure 9:
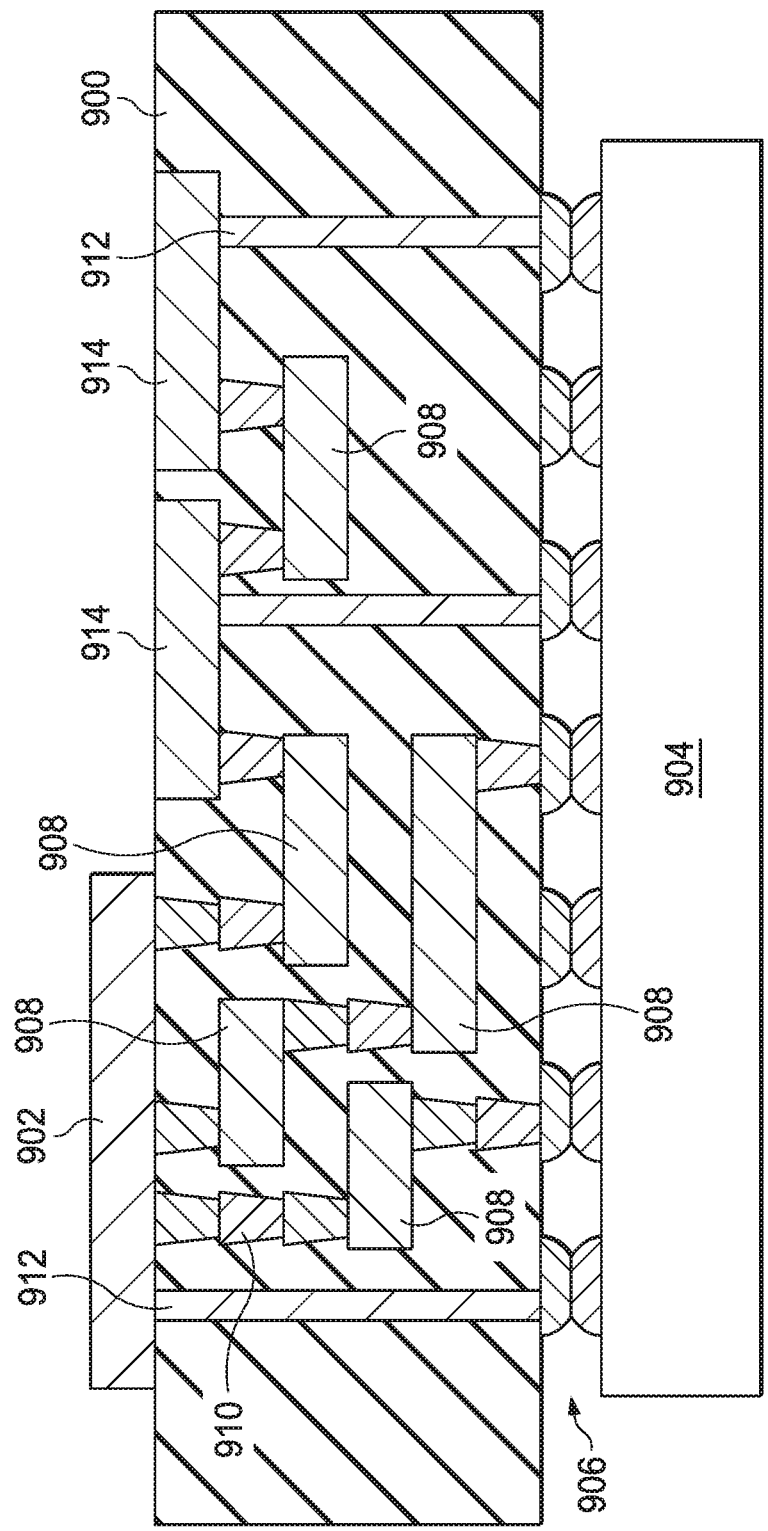
FIG. 9 is an interposer implementing one or more embodiments of the invention in accordance with embodiments of the present disclosure.

FIG. 9 illustrates an interposer 900 that includes one or more embodiments of the invention. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 612. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900.

In accordance with embodiments of the invention, apparatuses or processes disclosed herein may be used in the fabrication of interposer 900.

Figure 10:
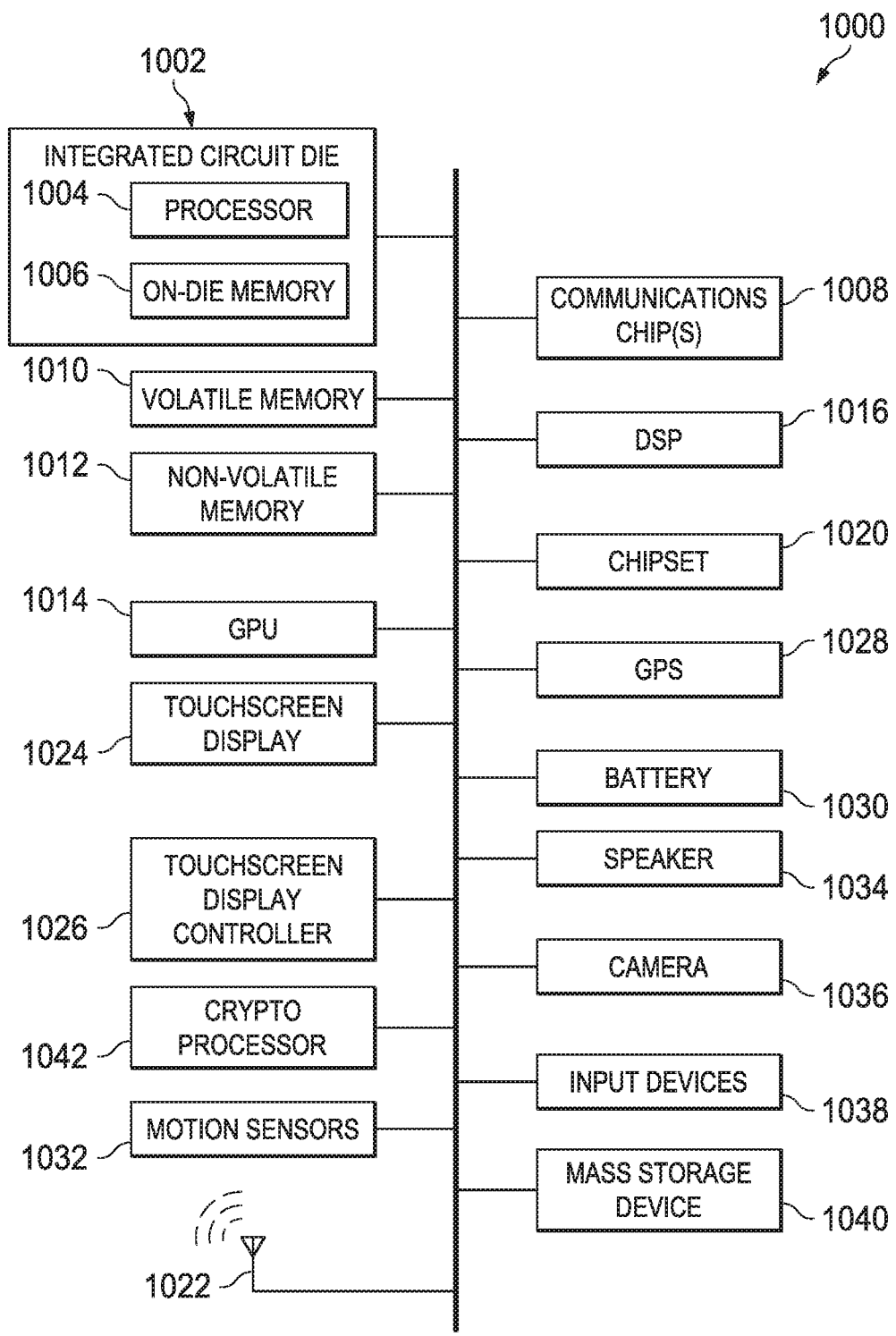
FIG. 10 is a computing device built in accordance with an embodiment of the invention in accordance with embodiments of the present disclosure.

FIG. 10 illustrates a computing device 1000 in accordance with one embodiment of the invention. The computing device 1000 may include a number of components. In one embodiment, these components are attached to one or more motherboards. In an alternate embodiment, some or all of these components are fabricated onto a single system-on-a-chip (SoC) die. The components in the computing device 1000 include, but are not limited to, an integrated circuit die 1002 and at least one communications logic unit 1008. In some implementations the communications logic unit 1008 is fabricated within the integrated circuit die 1002 while in other implementations the communications logic unit 1008 is fabricated in a separate integrated circuit chip that may be bonded to a substrate or motherboard that is shared with or electronically coupled to the integrated circuit die 1002. The integrated circuit die 1002 may include a CPU 1004 as well as on-die memory 1006, often used as cache memory, that can be provided by technologies such as embedded DRAM (eDRAM) or spin-transfer torque memory (SUM or STT-MRAM).

Computing device 1000 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 728 or other power source, a power amplifier (not shown), a voltage regulator (not shown), a global positioning system (GPS) device 728, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications logic unit 1008 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1008 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communications logic units 1008. For instance, a first communications logic unit 1008 may be dedicated to shorter range wireless communications such as Wi-Fi and Bluetooth and a second communications logic unit 1008 may be dedicated to longer range wireless communications such as GPS, EDGE, GPRS, CDMA, WiMAX, LTE, Ev-DO, and others.

The processor 1004 of the computing device 1000 includes one or more devices, such as transistors or metal interconnects, that are formed in accordance with embodiments of the invention. The term "processor" may refer to any device or portion of a device that processes electronic data from registers and/or memory to transform that electronic data into other electronic data that may be stored in registers and/or memory.

The communications logic unit 1008 may also include one or more devices, such as transistors or metal interconnects, that are formed in accordance with embodiments of the disclosure. The communications logic unit 1008 can include a communications front end.

In various embodiments, the computing device 1000 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Example 1 is an apparatus that includes a silicon 111 substrate; a gallium nitride transistor formed in a trench in the silicon 111 substrate, the gallium nitride transistor comprising a source electrode, a gate electrode, and a drain electrode; a polysilicon layer formed on the gallium nitride transistor, the polysilicon layer coplanar with a top side of the silicon 111 substrate; a first metal via disposed on the source electrode; a second metal via disposed on the gate electrode and isolated from the first metal via by a polysilicon layer; a first trench contact formed on the first metal via; and a second trench contact formed on the second metal via; the first trench contact isolated from the second trench contact by at least one polysilicon island.

Example 2 may include the subject matter of example 1, further comprising a silicon transistor formed on the silicon 111 substrate proximate to the gallium nitride transistor.

Example 3 may include the subject matter of example 2, wherein the silicon transistor comprises a p-type metal oxide semiconductor (PMOS) transistor.

Example 4 may include the subject matter of example 2 or 3, wherein the silicon transistor may also include a gate electrode may include a dielectric material on the silicon substrate, a gate metal on the dielectric material, and a dielectric spacer on each sidewall of the gate metal; and the silicon transistor may also include a source electrode on a first side of the gate electrode; and a drain electrode on a second side of the gate electrode, opposite the source electrode.

Example 5 may include the subject matter of example 4, wherein the RMG polysilicon gate may also include an oxide spacer to isolate the polysilicon from the source trench contact and the drain trench contact.

Example 6 may include the subject matter of example 1, wherein the gallium nitride transistor may also include an n-type metal oxide semiconductor (NMOS) transistor.

Example 7 may include the subject matter of example 1, wherein the at least one (RMG) polysilicon island may also include an oxide spacer to isolate the at least one RMG polysilicon island from the first trench contact.

Example 8 may include the subject matter of example 1, further comprising one or more oxide island structures residing on the polysilicon layer between the first metal via and the second metal via.

Example 9 is a method for forming a complementary metal oxide semiconductor (CMOS) device on a silicon 111 substrate, the method including forming a substrate trench in the silicon 111 substrate; forming a gallium nitride transistor in the substrate trench; forming a first oxide layer on the gallium nitride transistor; forming a polysilicon layer on the first oxide layer; and planarizing the polysilicon layer to be coplanar with the silicon 111 substrate; etching the polysilicon to form a polysilicon fin; depositing a high-k dielectric on the polysilicon fin; depositing a polysilicon on the high-k dielectric; selectively etching the polysilicon and the high-k dielectric to form polysilicon islands and to expose the polysilicon layer; forming insulating spaces on sidewalls of the polysilicon islands; forming a second oxide layer on the exposed polysilicon and on the polysilicon islands; selectively etching the second oxide layer and the polysilicon layer to expose a source electrode or drain electrode or gate electrode of the gallium nitride transistor; depositing a metal via on the exposed source electrode or drain electrode or gate electrode; and forming a trench contact on the metal via.

Example 10 may include the subject matter of example 9, wherein forming the gallium nitride transistor may also include forming a shallow trench isolation oxide in the substrate trench, the shallow trench isolation oxide comprising a plurality of oxide islands each separated by an isolation trench, each oxide island comprising a long axis on a direction parallel to the [11-2] direction; forming a gallium nitride layer in the isolation trenches and on the oxide islands; forming a polarization layer on the gallium nitride layer; etching the polarization layer in a first location to expose a first portion of the gallium nitride; forming a source electrode in the first portion of the gallium nitride; etching the polarization layer in a second location to expose a first portion of the gallium nitride; forming a drain electrode in the second portion of the gallium nitride; etching the polarization layer in a third location to expose a first portion of the gallium nitride; and forming a gate electrode in the third portion of the gallium nitride, the gate electrode residing between the source electrode and the drain electrode.

Example 11 may include the subject matter of example, and also include etching the silicon 111 substrate to form silicon 111 fins substantially collinear with the polysilicon fins.

Example 12 may include the subject matter of example 11, and also include depositing a high-k dielectric on the silicon 111 fin; depositing a polysilicon on the high-k dielectric; selectively etching the polysilicon and the high-k dielectric to form polysilicon islands and to expose the silicon 111 fin; forming insulating spaces on sidewalls of the polysilicon islands; and forming a trench contact between the RMG polysilicon islands.

Example 13 is a computing device that includes a processor mounted on a substrate; a communications logic unit within the processor; a memory within the processor; a graphics processing unit within the computing device; an antenna within the computing device; a display on the computing device; a battery within the computing device; a power amplifier within the processor; and a voltage regulator within the processor. The computing device may include a CMOS transistor that includes a silicon 111 substrate; a gallium nitride transistor formed in a trench in the silicon 111 substrate, the gallium nitride transistor comprising a source electrode, a gate electrode, and a drain electrode; a polysilicon layer formed on the gallium nitride transistor, the polysilicon layer coplanar with a top side of the silicon 111 substrate; a first metal via disposed on the source electrode; a second metal via disposed on the gate electrode and isolated from the first metal via by a polysilicon layer; a first trench contact formed on the first metal via; and a second trench contact formed on the second metal via; the first trench contact isolated from the second trench contact by at least one polysilicon island.

Example 14 may include the subject matter of example 13, and may also include a silicon transistor formed on the silicon 111 substrate proximate to the gallium nitride transistor.

Example 15 may include the subject matter of example 14, wherein the silicon transistor comprises a p-type metal oxide semiconductor (PMOS) transistor.

Example 16 may include the subject matter of example 14, wherein the silicon transistor may also include a source trench contact residing on the silicon 111 substrate; a polysilicon gate adjacent to the trench contact on the silicon 111 substrate; and a drain trench contact residing on the silicon substrate, the RMG polysilicon gate residing between the source trench contact and the drain trench contact.

Example 17 may include the subject matter of example 16, wherein the RMG polysilicon gate comprises an oxide spacer to isolate the polysilicon from the source trench contact and the drain trench contact.

Example 18 may include the subject matter of example 13, wherein the gallium nitride transistor comprises an n-type metal oxide semiconductor (NMOS) transistor.

Example 19 may include the subject matter of example 13, wherein the at least one polysilicon island comprises an oxide spacer to isolate the at least one polysilicon island from the first trench contact.

Example 20 may include the subject matter of example 13, and may also include one or more oxide island structures residing on the polysilicon layer between the first metal via and the second metal via.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus, comprising:
a support structure comprising a silicon material;
a trench in the support structure, the trench having sidewalls and a bottom, where the trench includes an island of the silicon material extending from a portion of the bottom of the trench;
a semiconductor material comprising gallium and nitrogen, the semiconductor material provided in a portion of the trench that is closest to the bottom of the trench so that the semiconductor material encloses sidewalls and a top side of the island; and
a transistor having a channel portion, the channel portion including a portion of the semiconductor material.

2. The apparatus according to claim 1, wherein a long axis of the island is in a [11-2] direction of the silicon material.

3. The apparatus according to claim 1, wherein the top side of the island has a 111 orientation of the silicon material.

4. The apparatus according to claim 1, wherein at least one of the sidewalls of the island has a 110 orientation of the silicon material.

5. The apparatus according to claim 1, wherein the bottom of the trench has a 111 orientation of the silicon material.

6. The apparatus according to claim 1, wherein the channel portion of the transistor is in the trench.

7. The apparatus according to claim 1, wherein each of a source region and a drain region of the transistor is in the trench.

8. The apparatus according to claim 1, further comprising a silicon layer over the semiconductor material, the silicon layer comprising silicon or polysilicon.

9. The apparatus according to claim 8, wherein the silicon layer is in the trench so that the semiconductor material is between the bottom of the trench and the silicon layer.

10. The apparatus according to claim 9, wherein a top side of the silicon layer is substantially coplanar with a top side of the support structure.

11. The apparatus according to claim 1, wherein the transistor is an N-type transistor.

12. The apparatus according to claim 11, further comprising a P-type transistor having a channel portion that includes a portion of the silicon material.

13. The apparatus according to claim 12, further comprising a complementary metal-oxide-semiconductor (CMOS) device, where the CMOS device includes the N-type transistor and the P-type transistor.

14. The apparatus according to claim 1, wherein the support structure is a silicon 111 substrate.

15. The apparatus according to claim 1, wherein the apparatus is one of a switch, a voltage regulator, and a power amplifier.

16. An apparatus, comprising:
a support structure comprising a silicon material;
a trench in the support structure;
a semiconductor material comprising gallium and nitrogen, the semiconductor material being in a portion of the trench that is closest to a bottom of the trench;
a transistor having a channel portion that includes a portion of the semiconductor material; and
a silicon layer, provided in the trench so that the semiconductor material is between the silicon layer and the bottom of the trench, the silicon layer comprising silicon or polysilicon.

17. The apparatus according to claim 16, wherein the transistor is an N-type transistor, and the apparatus further includes a P-type transistor having a channel portion that includes a portion of the silicon material.

18. The apparatus according to claim 16, wherein the apparatus is one of a switch, a voltage regulator, and a power amplifier.

* * * * *